(12) United States Patent  
Ouderkirk et al.

(10) Patent No.: US 9,360,176 B2
(45) Date of Patent: *Jun. 7, 2016

(54) REMOTE PHOSPHOR LED CONSTRUCTIONS

(71) Applicant: 3M INNOVATIVE PROPERTIES COMPANY, St. Paul, MN (US)

(72) Inventors: Andrew J. Ouderkirk, St. Paul, MN (US); Arokiaraj Jesudoss, Singapore (SG); Ravi Palaniswamy, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/556,610

(22) Filed: Dec. 1, 2014

(65) Prior Publication Data

US 2015/0084500 A1 Mar. 26, 2015

Related U.S. Application Data

(63) Continuation of application No. 13/991,037, filed as application No. PCT/US2011/065775 on Dec. 19, 2011, now Pat. No. 8,912,562.

(60) Provisional application No. 61/428,034, filed on Dec. 29, 2010.

(51) Int. Cl.
*H01L 33/00* (2010.01)
*F21K 99/00* (2016.01)
(Continued)

(52) U.S. Cl.
CPC ............. *F21K 9/56* (2013.01); *G02B 27/141* (2013.01); *H01L 33/50* (2013.01); *H01L 33/60* (2013.01); *H01L 33/507* (2013.01)

(58) Field of Classification Search
CPC .............................. H01L 33/52; H01L 33/60
USPC ........................ 257/89, 98, 99, 100
See application file for complete search history.

(56) References Cited

U.S. PATENT DOCUMENTS 4,774,434 A 9/1988 Bennion
5,882,774 A 3/1999 Jonza
(Continued)

FOREIGN PATENT DOCUMENTS

CN 101346818 1/2007
DE 10 2007 059548 4/2009
(Continued)

OTHER PUBLICATIONS

Chinese Search Report and Office Action in Application No. 201180063687.8, 1pg, dated Jun. 16, 2015.
(Continued)

*Primary Examiner* — Tan N Tran
(74) *Attorney, Agent, or Firm* — Gregg H. Rosenblatt

(57) ABSTRACT

A white light source includes a short wavelength LED and a phosphor layer that emits light at longer visible wavelengths. A dichroic reflector transmits the longer wavelength light, and reflects some LED light onto the phosphor such that as light travels from the LED to the dichroic reflector it does not pass through the phosphor. The LED may emit blue light, and the dichroic reflector may transmit a second portion of the LED light, such that the light source output light includes both the second portion of the LED light and the longer wavelength phosphor light. The LED may be mounted on a flexible substrate having a cavity region and neighboring region, the LED being mounted in the cavity region. A dielectric layer may be thinner in the cavity region than in the neighboring region, or a hole may extend completely through the dielectric layer in the cavity region.

20 Claims, 13 Drawing Sheets

(51) Int. Cl.
    *G02B 27/14*      (2006.01)
    *H01L 33/50*      (2010.01)
    *H01L 33/60*      (2010.01)

(56) References Cited

U.S. PATENT DOCUMENTS

| | | |
|---|---|---|
| 6,783,349 B2 | 8/2004 | Neavin |
| 6,967,778 B1 | 11/2005 | Wheatley |
| 7,070,300 B2 | 7/2006 | Harbers |
| 7,091,653 B2 | 8/2006 | Ouderkirk |
| 7,210,977 B2 | 5/2007 | Ouderkirk |
| 7,312,560 B2 | 12/2007 | Ouderkirk |
| 7,445,340 B2 | 11/2008 | Conner |
| 7,540,616 B2 | 6/2009 | Conner |
| 7,543,959 B2 | 6/2009 | Bierhuizen |
| 7,572,031 B2 | 8/2009 | Schultz |
| 7,710,045 B2 | 5/2010 | Schultz |
| 7,744,241 B2 | 6/2010 | Xu |
| 7,806,560 B2 | 10/2010 | Schultz |
| 8,269,245 B1 | 9/2012 | Shum |
| 8,575,642 B1 | 11/2013 | Shum |
| 8,740,413 B1 | 6/2014 | Krames |
| 8,985,794 B1 | 3/2015 | Katona |
| 2004/0145913 A1 | 7/2004 | Ouderkirk |
| 2005/0116235 A1 | 6/2005 | Schultz |
| 2005/0116635 A1 | 6/2005 | Walson et al. |
| 2005/0265029 A1 | 12/2005 | Epstein |
| 2006/0098438 A1 | 5/2006 | Ouderkirk |
| 2006/0203468 A1 | 9/2006 | Beeson |
| 2007/0001182 A1 | 1/2007 | Schardt et al. |
| 2007/0024191 A1 | 2/2007 | Chen et al. |
| 2007/0120089 A1 | 5/2007 | Mao |
| 2007/0290307 A1 | 12/2007 | Lin |
| 2009/0001399 A1 | 1/2009 | Diana et al. |
| 2010/0149814 A1 | 6/2010 | Zhai et al. |
| 2013/0270587 A1 | 10/2013 | Ouderkirk et al. |

FOREIGN PATENT DOCUMENTS

| | | |
|---|---|---|
| GB | 2 428 881 | 2/2007 |
| JP | 08-264841 | 10/1996 |
| JP | 2010-10298 | 1/2010 |
| TW | 200921952 | 5/2009 |
| WO | 2009/105198 | 8/2009 |
| WO | 2009/150561 | 12/2009 |
| WO | WO 2010143093 | 12/2010 |
| WO | 2012/061010 | 5/2012 |
| WO | 2012/061183 | 5/2012 |
| WO | 2012/061184 | 5/2012 |
| WO | 2012/091972 | 7/2012 |
| WO | 2012/091973 | 7/2012 |
| WO | 2012/091975 | 7/2012 |

OTHER PUBLICATIONS

Taiwan Search Report for Application No. 100149350, dated Jul. 21, 2015, 1pg.
Japanese Office Action dated Sep. 1, 2015 for Japanese Application No. 2013-547527, 3 pgs.
International Search Report for International Application No. PCT/US2011/065775 mailed on Apr. 4, 2012, 4 pages.

REMOTE PHOSPHOR LED CONSTRUCTIONS

CROSS-REFERENCE TO RELATED APPLICATIONS

This application is a continuation of U.S. application Ser. No. 13/991,037, filed May 31, 2013, now allowed, which is a national stage filing under 35 U.S.C. §371 of PCT/US2011/065775, filed Dec. 19, 2011, which claims priority to U.S. Provisional Application No. 61/428,034, filed Dec. 29, 2010, the disclosures of which is incorporated by reference in their entirety herein.

TECHNICAL FIELD

This invention relates generally to light sources, with particular application to solid state light sources that incorporate a light emitting diode (LED) and a phosphor. The invention also relates to associated articles, systems, and methods.

BACKGROUND

Solid state light sources that emit broadband light are known. In some cases, such light sources are made by applying a layer of yellow-emitting phosphor onto a blue LED. As light from the blue LED passes through the phosphor layer, some of the blue light is absorbed, and a substantial portion of the absorbed energy is re-emitted by the phosphor as Stokes-shifted light at longer wavelengths in the visible spectrum, typically, yellow light. The phosphor thickness is small enough so that some of the blue LED light passes all the way through the phosphor layer, and combines with the yellow light from the phosphor to provide broadband output light having a white appearance.

Other LED-pumped phosphor light sources have also been proposed. In U.S. Pat. No. 7,091,653, a light source is discussed in which ultraviolet (UV) light from an LED is reflected by a long-pass reflector onto a phosphor layer. The phosphor layer emits visible (preferably white) light, which light is substantially transmitted by the long-pass reflector. The LED, phosphor layer, and long-pass filter are arranged in such a way that as UV light travels from the LED to the long-pass reflector it does not pass through the phosphor layer.

SUMMARY

We have developed new families of broadband solid state light sources. These light sources utilize a phosphor layer or material that is pumped or excited by light from one or more LEDs. The sources also include a dichroic reflector that reflects at least some of the LED light onto the layer of phosphor. As light travels from the LED to the dichroic reflector, it does not pass through the phosphor layer.

In some cases, the LED emits blue light, and the dichroic reflector reflects a first portion of the blue LED light onto the phosphor layer, the dichroic reflector also transmitting a second portion of the blue LED light. The transmitted blue LED light combines with longer wavelength light emitted by the phosphor, which is also transmitted by the dichroic reflector, to provide a broadband output beam, e.g., light having a white appearance. We have found that light emitted by such sources can exhibit a surprising degree of spatial color uniformity.

In some cases, the LED and/or the phosphor are disposed on a flexible substrate having a cavity region and a neighboring region, the LED and/or phosphor being mounted or attached to the substrate in the cavity region. The flexible substrate preferably includes a dielectric layer, which is thinner in the cavity region than in the neighboring region. In some cases, a hole may extend completely through the dielectric layer in the cavity region, and one or more other components of the flexible substrate, such as an electrically conductive layer and/or a thermally conductive layer, may then provide physical support for the LED and/or phosphor in the cavity region. Whether or not a hole extends completely through the dielectric layer in the cavity region, we have found that such sources can provide exemplary thermal, mechanical, and optical characteristics.

The present application therefore discloses, inter alia, light sources that include a first blue-light emitting LED, a layer of phosphor material, and a dichroic reflector. The phosphor material may be adapted to emit light at longer visible wavelengths than the LED in response to excitation from the blue light emitted by the first LED. The dichroic reflector may be configured to reflect a first portion of the light emitted by the first LED onto the layer of phosphor material in such a way that as light propagates from the first LED to the dichroic reflector it does not pass through the layer of phosphor material, the dichroic reflector also substantially transmitting light at the longer visible wavelengths emitted by the phosphor. The dichroic reflector may be configured to transmit a second portion of the blue light emitted by the first LED, such that the light source emits broadband light, such as white light, the broadband light including a combination of the second portion of the light emitted by the first LED and the light at longer wavelengths emitted by the phosphor material.

In some cases, the first LED and the layer of phosphor material may be substantially coplanar. In some cases, the light source may further include a substrate on which at least the first LED is disposed. In some cases, the layer of phosphor material may also be disposed on the substrate. In some cases, the light source may also include a second blue-light emitting LED disposed on the substrate. In some cases, the substrate may be flexible and may include a dielectric layer having a cavity region and a neighboring region adjacent the cavity region, the first LED and/or the phosphor being disposed in the cavity region. In some cases, the cavity region may be characterized by a depression in the dielectric layer, the dielectric layer having a first thickness in the neighboring region and a second thickness in the cavity region, the second thickness being greater than zero but less than the first thickness. In some cases, the first thickness may be at least 20 microns, and the second thickness may be no more than 10 microns. In some cases, the cavity region may be characterized by a hole that extends completely through the dielectric layer. In some cases, the substrate may also include an electrically conductive material disposed on the dielectric layer, the LED being disposed on the electrically conductive material. In some cases, the electrically conductive layer may be disposed on a first side of the dielectric layer, and the substrate may also include a thermally conductive layer disposed on a second side of the dielectric layer opposite the first side.

We also disclose light sources that include a flexible substrate, a first LED, a layer of phosphor material, and a dichroic reflector. The first LED is adapted to emit LED light, and may be disposed on the flexible substrate. The phosphor material is adapted to emit light at longer wavelengths in response to excitation from the first LED light. The dichroic reflector may be configured to reflect at least a first portion of the light emitted by the first LED onto the layer of phosphor material in such a way that as light propagates from the first LED to the dichroic reflector it does not pass through the layer of phosphor material. The dichroic reflector may also substantially transmit light at the longer wavelengths emitted by the phosphor. The flexible substrate may include a dielectric layer having a cavity region and an adjacent neighboring region, and the first LED and/or the phosphor material may be disposed in the cavity region. The light source may emit broadband light that includes the light at longer wavelengths emitted by the phosphor material.

In some cases, the first LED may emit blue light. In some cases, the dichroic reflector may be configured to transmit a second portion of the light emitted by the first LED, and the broadband light emitted by the light source may comprise white light and may include a combination of the second portion of the light emitted by the LED and the light at longer wavelengths emitted by the phosphor material.

In some cases, the first LED may emit UV light. In some cases, the dichroic reflector may be configured to transmit little or none of the light emitted by the first LED, and the broadband light emitted by the light source may comprise white light and may include the light at longer wavelengths emitted by the phosphor material and little or none of the light emitted by the first LED.

In some cases, the cavity region may be characterized by a depression in the dielectric layer, the dielectric layer having a first thickness in the neighboring region and a second thickness in the cavity region, the second thickness being greater than zero but less than the first thickness. In some cases, the first thickness may be at least 20 microns, and the second thickness may be no more than 10 microns. In some cases, the cavity region may be characterized by a hole that extends completely through the dielectric layer. In some cases, the substrate may also include an electrically conductive material disposed on the dielectric layer, and the first LED may be disposed on the electrically conductive material. In some cases, the electrically conductive layer may be disposed on a first side of the dielectric layer, and a thermally conductive layer may be disposed on a second side of the dielectric layer opposite the first side. In some cases, the layer of phosphor material may also be disposed on the flexible substrate. In some cases, the light source may also include a second LED disposed on the flexible substrate.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION

Figure 1:
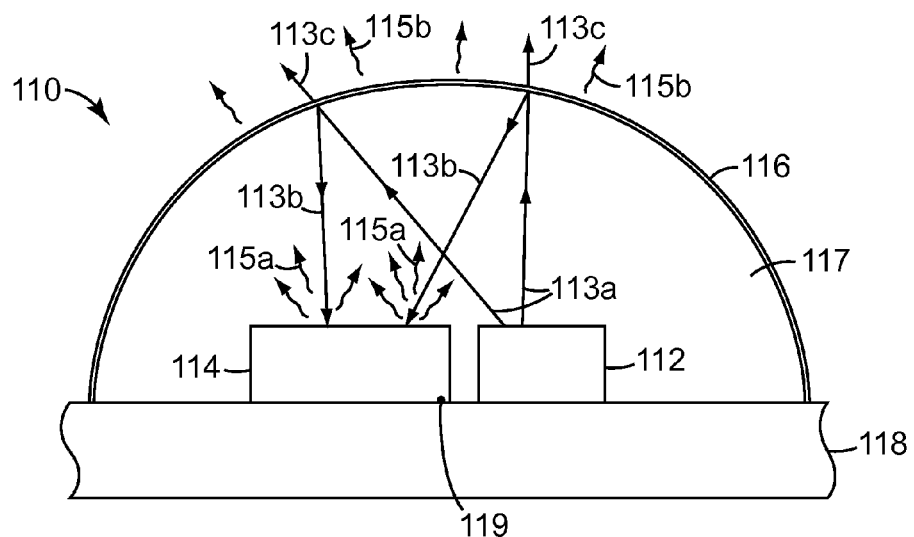
FIG. 1 is a schematic side or sectional view of a broadband light source.

As mentioned above, the present application describes broadband solid state light sources that utilize a phosphor layer or material that is pumped or excited by light from one or more LEDs. The sources also include a dichroic reflector that reflects at least some of the LED light onto the layer of phosphor. As light travels from the LED to the dichroic reflector, it does not pass through the phosphor layer. In some cases, the LED emits blue light, and the dichroic reflector reflects a first portion of the blue LED light onto the phosphor layer, the dichroic reflector also transmitting a second portion of the blue LED light. The transmitted blue LED light combines with longer wavelength light emitted by the phosphor, which is also transmitted by the dichroic reflector, to provide a broadband output beam, e.g., light having a white appearance. In some cases, the LED and/or the phosphor are disposed on a flexible substrate having a cavity region and a neighboring region, the LED and/or phosphor being mounted or attached to the substrate in the cavity region. The flexible substrate includes a dielectric layer, which is thinner in the cavity region than in the neighboring region.

In this regard, "light emitting diode" or "LED" refers to a diode that emits light, whether visible, ultraviolet, or infrared. It includes incoherent encased or encapsulated semiconductor devices marketed as "LEDs", whether of the conventional or super radiant variety. An "LED die" is an LED in its most basic form, i.e., in the form of an individual component or chip made by semiconductor processing procedures. For example, the LED die may be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can also be used, as well as inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. An "LED" for purposes of this application should also be considered to include organic light emitting diodes, commonly referred to as OLEDs.

All disclosed embodiments of broadband solid state light sources that utilize blue light-emitting LEDs may or may not also utilize the exemplary flexible substrates, and all disclosed embodiments that utilize the exemplary substrates may or may not also utilize blue-light emitting LEDs. We begin with a discussion of some embodiments that include one or more blue-light emitting LEDs.

In FIG. 1, we see a schematic side or sectional view of a broadband light source 110. The source 110 includes a blue-light emitting LED 112 and phosphor layer 114 attached to a substrate 118. The LED 112 emits blue light 113*a* in all directions from its exposed outer surfaces, with two rays of such light being labeled in the figure.

Blue light 113*a* from the LED 112 impinges upon a dichroic reflector 116. A dichroic reflector, also sometimes referred to as a dichroic mirror, is a reflector designed to have a high reflectivity (and low transmission) for some optical wavelengths, and a low reflectivity (and high transmission) for other optical wavelengths. Such reflectors ordinarily have negligible absorption, such that any light that is not reflected is substantially transmitted, and vice versa, at least over visible and near infrared wavelengths. Such reflectors comprise stacks of optically thin microlayers, typically in an alternating arrangement of materials having a large refractive index mismatch, such as alternating layers of silicon dioxide and titanium dioxide, but other suitable inorganic or organic materials may also be used. Such reflectors may be made by vacuum deposition of the alternating layers on a glass or other suitable substrate. Alternatively, suitable reflective films may be made by a continuous process that may involve coextrusion of alternating polymer materials and stretching the resulting multilayer polymer web, e.g. as described in U.S. Pat. Nos. 5,882,774 and 6,783,349. Regardless of the materials used in the dichroic reflector and the method of manufacture used, the reflector is provided with a layer thickness profile for the stack of microlayers that is tailored to provide the desired reflection characteristics as a function of wavelength, as described elsewhere herein. Reference in this regard is made to U.S. Pat. No. 6,967,778. The thickness profile may be tailored to provide a dichroic reflector that operates as a long pass filter or a notch filter, for example. In some cases the dichroic reflector may be or comprise a multilayer mirror film, a reflective polarizer, and/or a partially polarizing reflector such as a mirror that, at a given wavelength, reflects all of one polarization of light and partially reflects the orthogonal polarization.

The dichroic reflector 116 is tailored to reflect a first portion of the blue LED light, and transmit a substantially complementary second portion of the blue LED light. The reflector 116 is also shaped or otherwise configured to direct the reflected blue light 113*b* onto the phosphor layer 114. For example, as shown in the figure, the dichroic reflector may have a convex shape that opens toward or encompasses the LED and phosphor. The convex shape may be a simple hemisphere or other portion of a sphere, or it may be parabolic, elliptical, or any other regular or irregular aspheric shape, or it may be piecewise hemispherical or aspheric, for example by being made of a plurality of small or large flat facets that are arranged to approximate a desired smooth shape. In some cases the dichroic reflector may be freestanding, while in other cases it may be applied, e.g. as a thin film, to an inner, outer, or embedded surface of another component. For example, in the case of source 110, the interior space 117 may comprise a suitable light-transmissive glass or polymer material that encapsulates the LED and the phosphor, and the dichroic reflector may be applied to the outer surface of such an encapsulant. The encapsulant may not only provide structural integrity and robustness to the light source design, but it may also improve the efficiency of the light source by reducing the amount of light trapped by total internal reflection inside the LED die. Alternatively, the interior space 117 may be unfilled, e.g., it may comprise only air or vacuum.

In exemplary embodiments the dichroic reflector may be tailored to reflect an amount ranging from 50 to 95% of the blue light from the LED, and to transmit the remainder of such light. Exemplary dichroic reflectors may also transmit most of the longer wavelength visible light emitted by the phosphor, preferably more than 75%, 80%, 85%, or 90% of such light, for example.

The shape or other configuration of the dichroic reflector 116 is preferably tailored to direct the reflected light 113*b* from the blue-light emitting LED onto the phosphor layer 114. Preferably, the reflector directs the reflected light in such a way as to form a substantial image of the LED, or of a portion thereof, on at least a portion of the phosphor layer. An "image" in this regard need not be a high quality image in the photographic sense, but may simply be an area of increased brightness whose shape at least approximates the shape of the LED or any emitting portion(s) thereof. In a simple embodiment, the reflector 116 may have the shape of a hemisphere or other portion of a sphere, the center of curvature of which is depicted as point 119 in FIG. 1. A spherical reflective surface has a (paraxial) focal length equal to half of its radius of curvature, and an arbitrary object point in a plane that contains the center of curvature is imaged by the spherical surface to an image point that lies on the same plane, and the line segment that joins the object point to the image point is bisected by the center of curvature. In the embodiment of FIG. 1, the LED 112 is shown to be offset to the right of the center of curvature 119, and the phosphor layer 114 is shown to be offset to the left. Even though the upper emitting surface of LED 112 may not lie precisely in a horizontal plane containing point 119 (note that the height of LED 112 is shown exaggerated in the schematic view of the figure), in many cases it will be close enough so that a substantial image—of similar size and shape as the LED emitting surface—is formed on the opposite side of the point 119. It is here that the phosphor layer 114 is placed so as to efficiently intercept the reflected LED light. Note that although the phosphor layer may be patterned to have the same or similar size and shape as the LED, this need not be the case in general, and in many cases it is advantageous to make the phosphor layer larger than the LED or oversized relative to the LED or its image, so that as much of the reflected LED light as possible is intercepted by the phosphor. Even in the schematic view of FIG. 1, for example, we see that phosphor layer 114 is larger in transverse (in-plane) dimension than LED 112.

There are advantages to keeping the LED close to the center of curvature 119, and close to the optical axis of the light source (which in the present case is an axis perpendicular to substrate 118 and passing through point 119). By keeping the LED and its image close to the optical axis, the output light can be better collimated, and can have a lower etendue. If multiple LEDs are used, lower etendues can generally be achieved by positioning each LED as close to the optical axis as possible, without obstructing the images of other LEDs. Heat management may also play a role in determining the optimal placement of multiple LEDs, since closely spaced LEDs may result in higher operating temperatures, which may detrimentally affect the output power of the LEDs.

In addition to being disposed on opposite sides of the center of curvature 119, it is usually advantageous to position the LED and phosphor layer so that they are generally co-planar. "Co-planar" in this regard does not require a given surface of the LED to be located in precisely the same geometric plane as a surface of the phosphor layer, or vice versa, but can also be understood to include cases where the components are close enough to the same plane so that the phosphor layer intercepts all, or at least a substantial portion, of the reflected light from the LED.

A significant design feature of the light source 110, and of other light sources disclosed herein, is that as light travels from the LED to the dichroic reflector, it does not pass through the phosphor layer 114. This design feature differs from the design of many LED-pumped phosphor sources in which light from the LED passes through the phosphor layer before impinging upon any reflector of LED light. A significant benefit of the disclosed designs is that the side or surface of the phosphor layer that is initially impinged upon by the reflected LED light is also the side or surface of the phosphor layer that faces toward the output of the light source. Stated differently, with reference to FIG. 1, reflected light from the LED initially impinges upon the upper surface of phosphor layer 114, which upper surface faces upward or outward towards the output of the light source 110. The reflected LED light penetrates to some extent into the phosphor layer 114, depending on the amount of absorption and scattering in that layer, but in any case the intensity of such light diminishes with increasing depth below the upper surface. As a result, the intensity of fluorescent light that is generated in the volume of the phosphor layer 114 is brightest at the upper surface, and diminishes with increasing depth below that surface. Such an arrangement can provide reduced absorption and scattering of LED light and phosphor light, and enhanced overall efficiency for the light source.

In some cases, the physical thickness and absorption coefficient of the phosphor layer 114 at the wavelength(s) of the LED light may be tailored such that substantially all of the LED light that impinges upon the phosphor layer is absorbed or otherwise scattered such that substantially none reaches the rear or back surface of the phosphor layer, which surface may be in contact with the substrate 118.

In other cases, the physical thickness of the phosphor layer may be reduced, and/or its absorption coefficient at the LED wavelength(s) reduced, such that a substantial portion of the impinging LED light may reach the back or rear surface of the phosphor layer. In these latter cases, a reflective layer may be provided at the back surface of the phosphor layer to allow the remaining LED light to propagate again through the thickness of the phosphor layer so as to generate more fluorescent light. Embodiments utilizing a reduced thickness phosphor layer are generally advantageous from a heat management standpoint, because the reduced thickness of the phosphor layer can be used to increase the typically poor thermal coupling of upper portions of the phosphor layer to an underlying heat sink. Phosphor layers typically have dramatically lower thermal conductivities than LEDs, and any design techniques that can help draw heat away from the phosphor layer can advantageously help to lower the operating temperature of the phosphor.

As explained elsewhere herein, the phosphor material emits light of generally longer wavelength than that of the LED by absorbing the LED light and emitting the absorbed energy as lower energy (longer wavelength) radiation. The light conversion process involves loss associated with the Stokes shift to the lower energies as well as nonradiative losses, all of these losses typically manifesting themselves as heat generated in the phosphor layer. Exemplary phosphor materials absorb blue light, e.g., light in a wavelength range from about 430-470 nm, and provide fluorescent emission in lower energy portions of the visible spectrum, e.g., in the range from 500-700 nm. An exemplary phosphor material is cerium-doped yttrium aluminum garnet (Ce:YAG). Other suitable phosphor materials include other known types of doped YAG, orthosilicate, nitride, or sulfide materials. In some cases the phosphor layer or material may comprise a mixture of one or more types of phosphor particles in a suitable binder material.

The longer visible wavelength light emitted by the phosphor layer is labeled 115a in FIG. 1. The dichroic reflector 116 is tailored to substantially transmit light of these longer wavelengths. As a result, the phosphor light 115a is efficiently transmitted as phosphor light 115b, such light also potentially being refracted at the reflector 116 depending upon the material (if any) filling the interior space 117 and the material (if any) on the outer or opposite side of the reflector 116. In an exemplary embodiment, the interior space 117 may be filled with a clear glass or polymer encapsulant, and the space on the opposite side of the mirror 116 may be air or vacuum, such that refraction by the encapsulant provides some degree of collimation of the light from the LED and phosphor layer, provided those components are disposed relatively close to the center of curvature 119 or the optical axis of the light source. In addition to transmitting the phosphor light 115a, the dichroic reflector 116 is also tailored to transmit a portion of the LED light 113a, such transmitted LED light being labeled 113c in the drawing. The transmitted light 113c and transmitted light 115b combine spatially to provide broadband output light for the light source 110.

Any suitable substrate may be used as substrate 118 to carry the LED 112 and phosphor layer 114. The substrate may include conductive layers or traces to carry electrical power to the LED. The substrate also preferably has a relatively high heat conduction and relatively low thermal resistance in order to effectively carry heat away from the LED and/or phosphor layer so as to maintain lower operating temperatures thereof. To promote such lower operating temperatures, the substrate may include or be thermally coupled to a suitable heat sink, e.g., a relatively thick layer of copper, aluminum, or other suitable metal or other thermally conductive material. In some cases the substrate may be or comprise a highly reflective surface such as a metal mirror, a metal mirror with dielectric coatings to enhance reflectivity, or a diffusely reflective surface such as microvoided polyester or titania filled polymer, or a multilayer optical film such as 3M™ Vikuiti™ Enhanced Specular Reflector (ESR) film. The substrate may also be or comprise any of the substrates discussed elsewhere herein.

Figure 2:
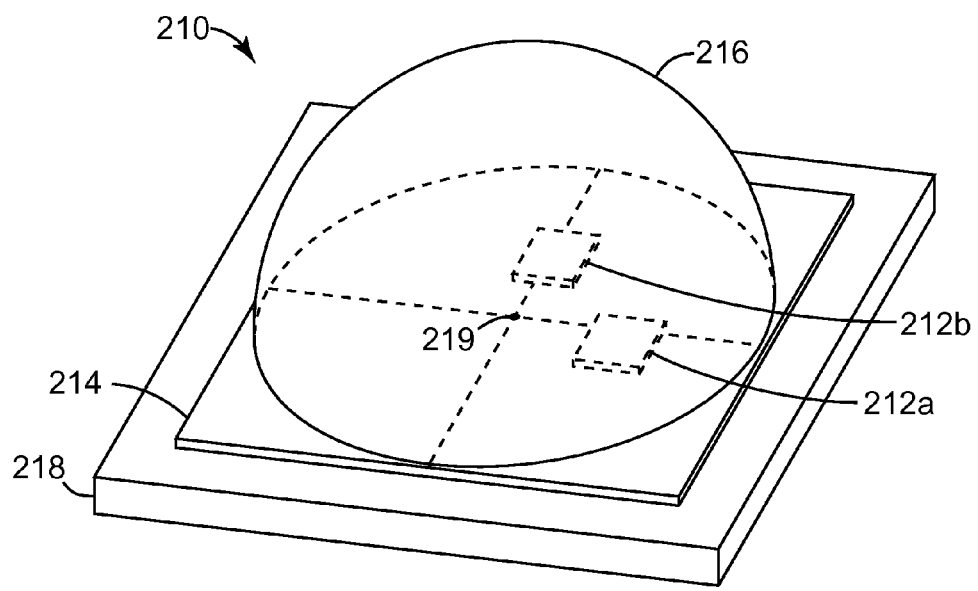
FIG. 2 is a schematic perspective view of a broadband light source.

FIG. 2 shows a schematic perspective view of another broadband light source 210. The light source 210 includes two blue-light emitting LEDs 212a, 212b disposed on a substrate 218, the substrate also having thereon a phosphor layer 214 that emits longer wavelength visible light when exposed to the blue light from the LEDs. The LEDs 212a, 212b preferably emit the same color of blue light, i.e., they have the same or similar emission spectra. The LEDs may also have the same size and shape, although this is not necessary, and LEDs having different sizes and shapes are also contemplated, as well as LEDs that have somewhat different emission spectra of blue light.

The source 210 also includes a dichroic reflector 216 having a convex shape that opens toward and encompasses the LEDs and a disk-shaped portion of the oversized phosphor layer 214. The center of the disk-shaped portion is marked by a point 219, which also corresponds to the center of curvature for the reflector 216. The LEDs 212a, 212b are positioned relatively close to the point 219, but are arranged along orthogonal in-plane axes such that neither LED obstructs the image of the other LED that is formed by the convex dichroic reflector.

One difference between source 210 and source 110 is the lateral dimension of the phosphor relative to the lateral dimensions of the LED(s) and the base of the dichroic reflector. In source 110, the phosphor layer has a lateral dimension similar to that of the LED and substantially less than that of the dichroic reflector base. In source 210, the phosphor layer has a lateral dimension much larger than that of the LED(s), and similar to that of the dichroic reflector base. In fact, the phosphor layer 214 of source 210 completely fills the outer perimeter or base of the dichroic reflector 216. One advantage of this approach is the avoidance of any need to align the phosphor layer relative to the LED or relative to the dichroic reflector. One disadvantage is the unnecessary use of phosphor material, since only a small portion of the entire phosphor layer 214 will be excited by reflected light from the LEDs, that small portion of the phosphor layer also being the portion that contributes to the output light of the light source. A corresponding advantage of the approach of light source 110 relative to light source 210 is the more efficient allocation of phosphor material.

Design details of LEDs, phosphors, dichroic reflectors, substrates, and other light source elements discussed in connection with FIG. 1 and elsewhere herein will be understood to apply equally to corresponding elements of the light source 210.

Figure 3A:
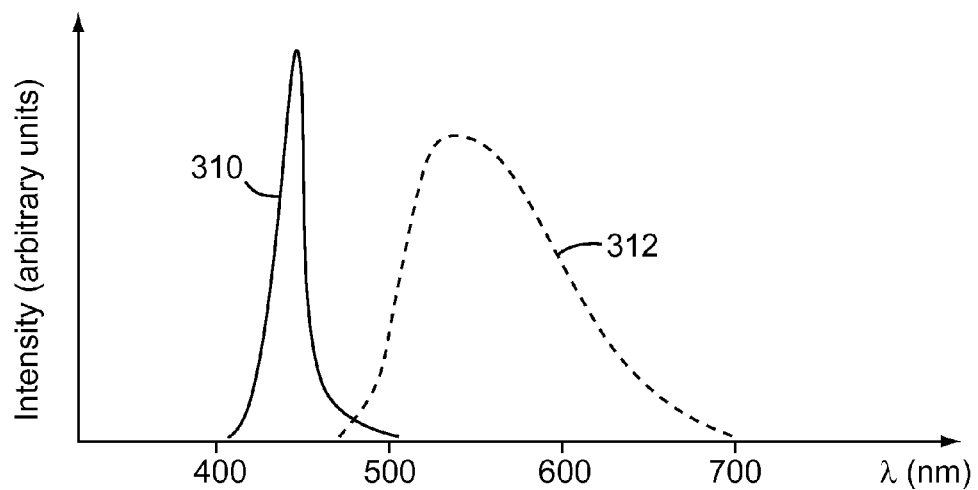
FIG. 3a is an idealized graph of the spectral intensity distributions of an exemplary blue LED and an exemplary phosphor.

FIG. 3a is an idealized graph of the spectral intensity distributions of an exemplary blue LED and an exemplary phosphor. In particular, curve 310 represents in schematic fashion the approximate spectral distribution of a blue-light emitting LED. Curve 312 represents in schematic fashion the approximate spectral distribution of light emitted by an exemplary phosphor material when exposed to light from the blue LED. The reader will understand that these curves are provided to aid in the understanding of the invention, and are not intended to be limiting. The reader will also understand that combinations of light from curve 310 and light from curve 312 can provide broadband output light having an appearance that is substantially white or of other desired hues. By changing the relative proportion of blue LED light and longer wavelength phosphor light, white output light can be provided whose color temperature can be tuned to a desired value. Color temperatures within a range from 3000 to 7000 degrees Kelvin are within the scope of this disclosure.

Figure 3B:
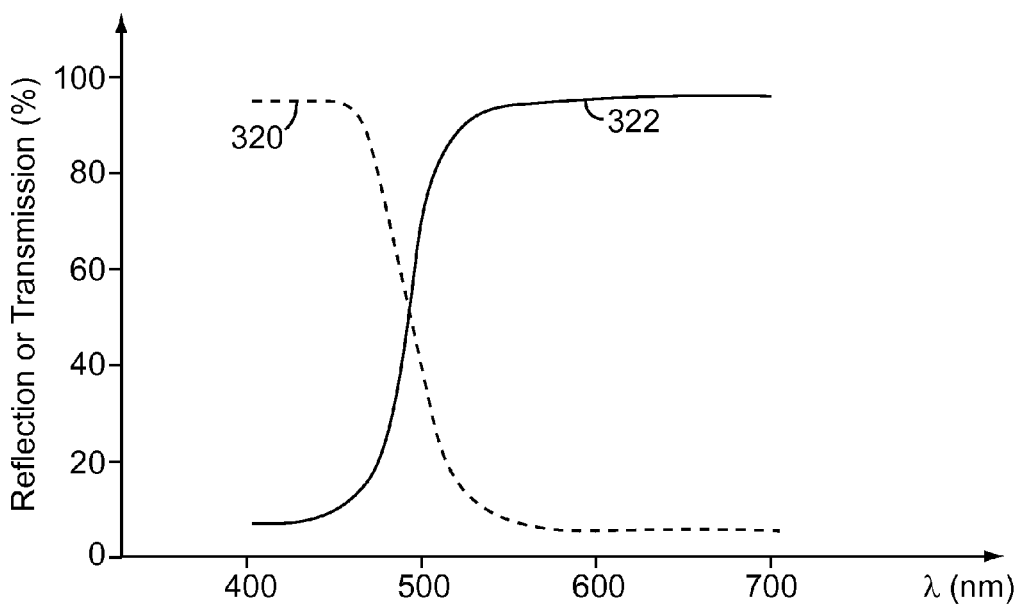
FIG. 3b is an idealized graph of the spectral reflectance or transmission of an exemplary dichroic reflector.

FIG. 3b is an idealized graph of the spectral reflectance or transmission of an exemplary dichroic reflector for use with blue LEDs and yellow or other broadband visible light emitting phosphors. Here again, the reader will understand that these curves are provided to aid in the understanding of the invention, and are not intended to be limiting. Curve 320 represents in schematic fashion the percent reflection of the dichroic reflector for normally incident light, and curve 322 represents the corresponding percent transmission. These curves are substantially complementary because of the low loss nature of most dichroic reflectors. Light that strikes the dichroic reflector at angles other than normal incidence may experience transmission and reflection characteristics that are similar to or substantially different from curves 320, 322, the degree of similarity or difference depending on the angle of incidence and also potentially depending on the polarization state of the light. In general, light that is incident at moderate non-normal angles experience reflection and transmission characteristics that are simply shifted to the left (towards shorter wavelengths) relative to the normal incidence curves 320, 322. In most cases, light from the LED or from the phosphor layer impinges upon a given portion of the dichroic reflector over a distribution or range of incidence angles, and that range or distribution changes as a function of the portion of the dichroic reflector under consideration.

In part due to these potentially complicating geometric factors associated with dichroic reflectors, it is often generally advantageous to position the LEDs so that they are relatively close to the optical axis of the light source and to the center of curvature of the dichroic reflector. This arrangement can help to keep incidence angles of light from the LED, and light from the phosphor, reasonably close to normal incidence over the area of the dichroic reflector.

The reader will note that curve 322 exhibits a small but non-zero amount of transmission for blue light, e.g. in the vicinity of 430-470 nm. Tailoring the dichroic reflector in this way ensures that some of the blue LED light will be transmitted by the dichroic reflector and mixed with the longer wavelength light from the phosphor to provide the broadband output light. Suitable adjustment of the dichroic reflector, which may involve increasing or decreasing the asymptotic level of reflection or transmission in the blue spectral region and/or in the longer wavelength region from 500-700 nm, and/or shifting the curves 320, 322 to shorter or longer wavelengths, can be done to change the proportion of blue LED light to longer wavelength phosphor light in the output beam.

Such changes may allow for the adjustment of the color temperature of white output light, as discussed above.

Figure 3C:
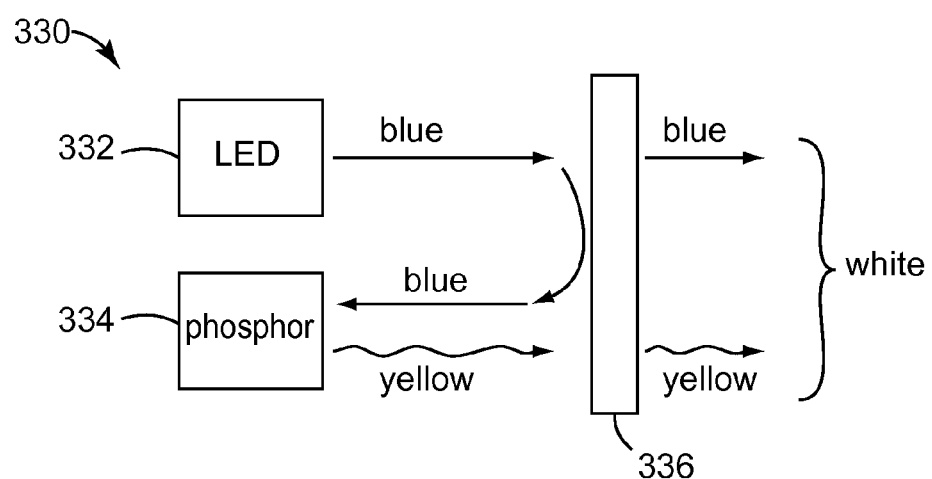
FIG. 3c is a schematic diagram showing how some light from a blue LED can combine with longer wavelength light emitted by a phosphor to provide broadband white output light.

FIG. 3c is a schematic diagram showing a light source 330 in which some light from a blue LED 332 is combined with longer wavelength light emitted by a phosphor 334 to provide broadband white output light. The long wavelength light from the phosphor may have a yellow appearance or other color depending on the phosphor material(s) used. A dichroic reflector 336, which again is shown only schematically, allows some blue light from the LED 332 to be transmitted, and reflects the remaining blue LED light onto the phosphor 334. The reflected blue LED light excites the phosphor and causes it to emit the Stokes-shifted longer wavelength light, which is highly transmitted by the dichroic reflector 336. The combination or mixture of blue light from the LED and longer wavelength light from the phosphor provides broadband output light, e.g., white light.

Figure 4:
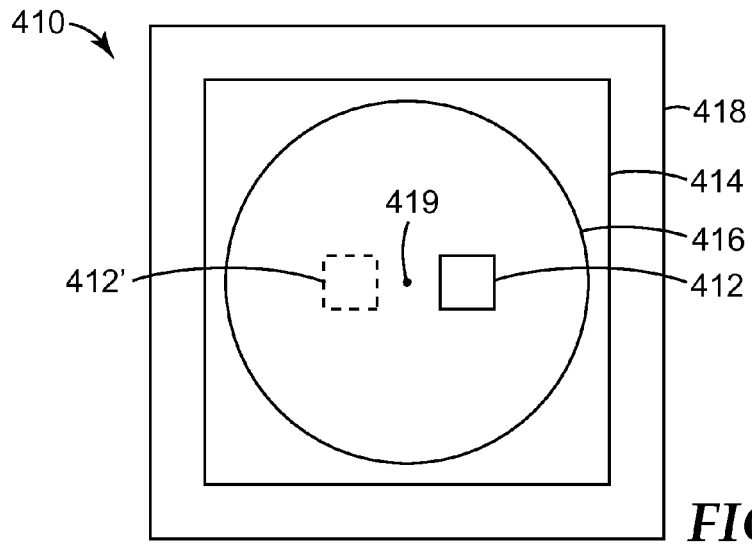
FIG. 4 is a schematic plan view of a broadband light source.

FIG. 4 is a schematic plan view of a broadband light source 410 that is similar in many respects to the light sources of FIGS. 1 and 2. The light source 410 has only one blue-light emitting LED 412 disposed on a substrate 418, the substrate also having thereon an oversized phosphor layer 414 that emits longer wavelength visible light when exposed to the blue light from the LED.

The source 410 also includes a dichroic reflector 416. In the plan view of FIG. 4, only the shape or circumference of the lower base of the dichroic reflector is seen, but the reader will understand that the reflector has a convex shape similar to the dichroic reflectors of FIGS. 1 and 2. The reflector 416 opens toward and encompasses the LED and a disk-shaped portion of the phosphor layer 414. The center of the disk-shaped portion is marked by a point 419, which also corresponds to the center of curvature for the convex reflector 416. The LED 412 is positioned relatively close to the point 419. The convex reflector 416 produces an image of the LED 412 in the image region 412'.

An embodiment of the light source 410 was modeled using LightTools™ optical design software. Some relevant design parameters included the following:

the phosphor layer was assumed to be composed of Ce:YAG particles of refractive index 1.8 immersed in a silicone binder of refractive index 1.41, the layer having a physical thickness of 0.1 mm;

the LED was assumed to be square with in-plane dimensions of 1 mm by 1 mm, a thickness of 10 microns, and an output wavelength of 460 nm. The LED was also assumed to have a thin reflective coating on its back surface (adjacent the phosphor layer), the reflective coating having a 50% reflectivity and 50% absorption;

the dichroic reflector was assumed to be disposed on a hemispherical convex surface of a plano-convex lens made of BK7 glass, the lens having a diameter of 5 mm and a radius of curvature of 2.5 mm. The dichroic reflector was assumed to have a reflectivity of 90% and a transmission of 10% for normally incident light at the 460 nm LED wavelength. The dichroic reflector was also assumed to have a transmission of about 100% for normally incident light whose wavelength was 490 nm or greater;

the plano-convex lens was positioned such that its planar side was disposed at the top surface of the LED, and the space between the planar side of the lens and the top of the phosphor layer was filled with silicone material of index 1.41, the silicone material thus also encapsulating the LED.

Figure 4A:
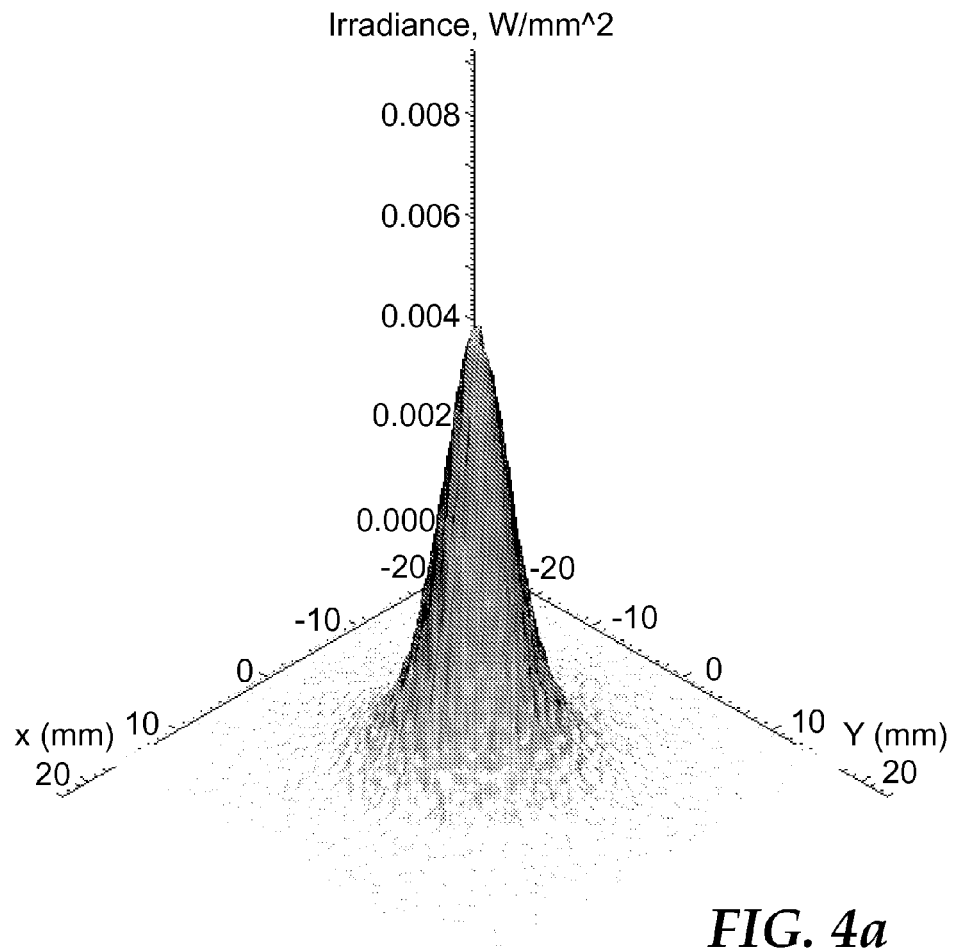
FIG. 4a is a graph of modeled/calculated irradiance as a function of transverse position for a light source having a design similar to that of FIG. 4, the irradiance being measured in a plane above or in front of the light source.
Figure 4C:
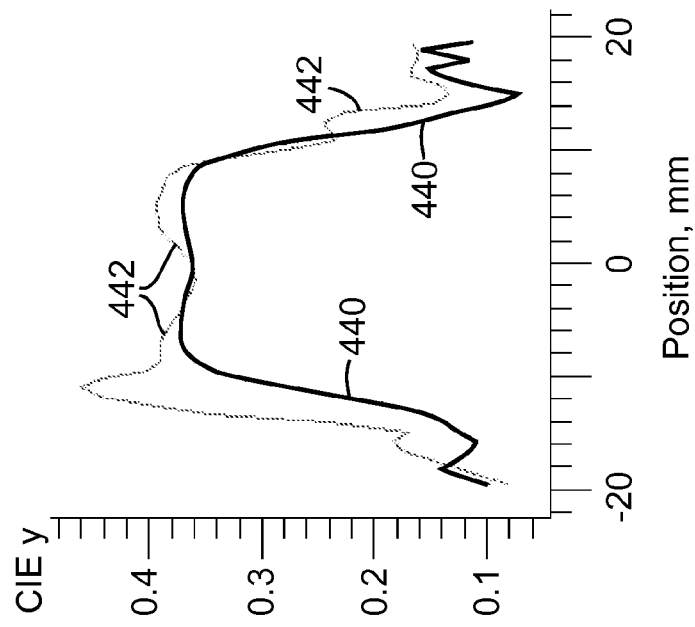
FIG. 4c is a graph of the CIE y color coordinate of the irradiance distribution of FIG. 4a, measured as a function of position along two orthogonal axes.
Figure 4B:
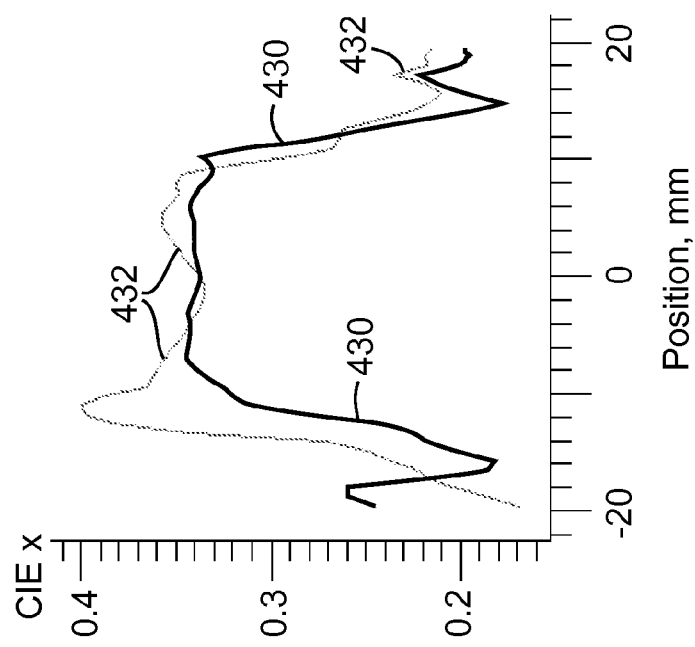
FIG. 4b is a graph of the CIE x color coordinate of the irradiance distribution of FIG. 4a, measured as a function of position along two orthogonal axes.

The output light provided by this embodiment of light source 410 was modeled using the LightTools software. Of particular interest was the physical distribution of the output light as observed in an observation plane disposed 5 mm above the plane of the LED, which was about 2.5 mm above the apex of the plano-convex lens and dichroic reflector 416. FIG. 4a depicts the total irradiance or brightness of the output light in this observation plane as a function of position in the plane. FIGS. 4b and 4c depict the CIE chromaticity coordinates of the output light in the observation plane along two orthogonal in-plane axes, where curves 430 and 432 depict the CIE "x" coordinate as a function of position in the observation plane, and curves 440 and 442 depict the CIE "y" coordinate as a function of position in the observation plane. (The reader should not confuse these CIE "x" and "y" chromaticity coordinates with the spatial x and y coordinates in FIG. 4a, which are given in millimeters of displacement relative to the optical axis, in the observation plane.) Curves 430 and 440 correspond to measurements along one in-plane axis, and curves 432 and 442 correspond to measurements along the orthogonal in-plane axis in the observation plane.

FIG. 4a demonstrates that the light source 410 is capable of emitting a high brightness, low etendue output beam. Comparison of the curves in FIGS. 4b and 4c reveals that the output beam exhibits an unexpectedly uniform distribution of color over the area of the output beam, even though significantly different colors are generated at different positions or locations underneath the convex dichroic reflector. For example, in the plane of the LED and phosphor, the LED 412 emits blue light, while the portion of the phosphor layer at the image region 412' emits substantially yellow light.

Figure 5:
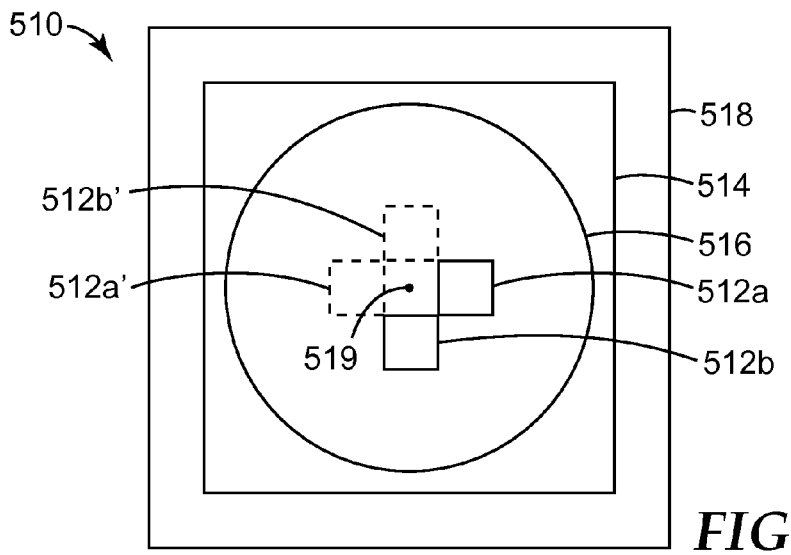
FIG. 5 is a schematic plan view of a broadband light source that includes two LEDs.

FIG. 5 is a schematic plan view of a broadband light source 510 that is similar to light source 410 of FIG. 4, except that the light source 510 has two blue-light emitting LEDs 512a, 512b. The LEDs 512a, 512b are disposed on a substrate 518, the substrate also having thereon an oversized phosphor layer 514 that emits longer wavelength visible light when exposed to the blue light from the LEDs.

The source 510 also includes a dichroic reflector 516. In the plan view of FIG. 5, only the shape or circumference of the lower base of the dichroic reflector is seen, but the reader will understand that the reflector has a convex shape similar to the dichroic reflectors of FIGS. 1 and 2. The reflector 516 opens toward and encompasses the LEDs and a disk-shaped portion of the phosphor layer 514. The center of the disk-shaped portion is marked by a point 519, which also corresponds to the center of curvature for the convex reflector 516. The LEDs 512a, 512b are positioned relatively close to the point 519 along orthogonal in-plane axes. The convex reflector 516 produces an image of the LED 512a in the image region 512a', and produces an image of the LED 512b in the image region 512b'.

An embodiment of the light source 510 was modeled using LightTools™ optical design software, in an analogous manner to the light source that was modeled from light source 410. Some relevant design parameters of the modeled embodiment of light source 510 included the following:

the phosphor layer was assumed to be composed of Ce:YAG particles of refractive index 1.8 immersed in a silicone binder of refractive index 1.41, the layer having a physical thickness of 0.1 mm;

the LEDs were each assumed to be square with in-plane dimensions of 1 mm by 1 mm, a thickness of 10 microns, and an output wavelength of 460 nm. Each LED was also assumed to have a reflective coating on its back surface (adjacent the phosphor layer), the reflective coating having a 50% reflectivity and 50% absorption;

the dichroic reflector was assumed to be disposed on a hemispherical convex surface of a plano-convex lens made of BK7 glass, the lens having a diameter of 5 mm and a radius of curvature of 2.5 mm. The dichroic reflector was assumed to have a reflectivity of 90% and a transmission of 10% for normally incident light at the 460 nm LED wavelength. The dichroic reflector was also assumed to have a transmission of about 100% for normally incident light whose wavelength was 490 nm or greater;

the plano-convex lens was positioned such that its planar side was disposed at the top surface of the LEDs, and the space between the planar side of the lens and the top of the phosphor layer was filled with silicone material of index 1.41, the silicone material thus also encapsulating the LEDs.

Figure 5A:
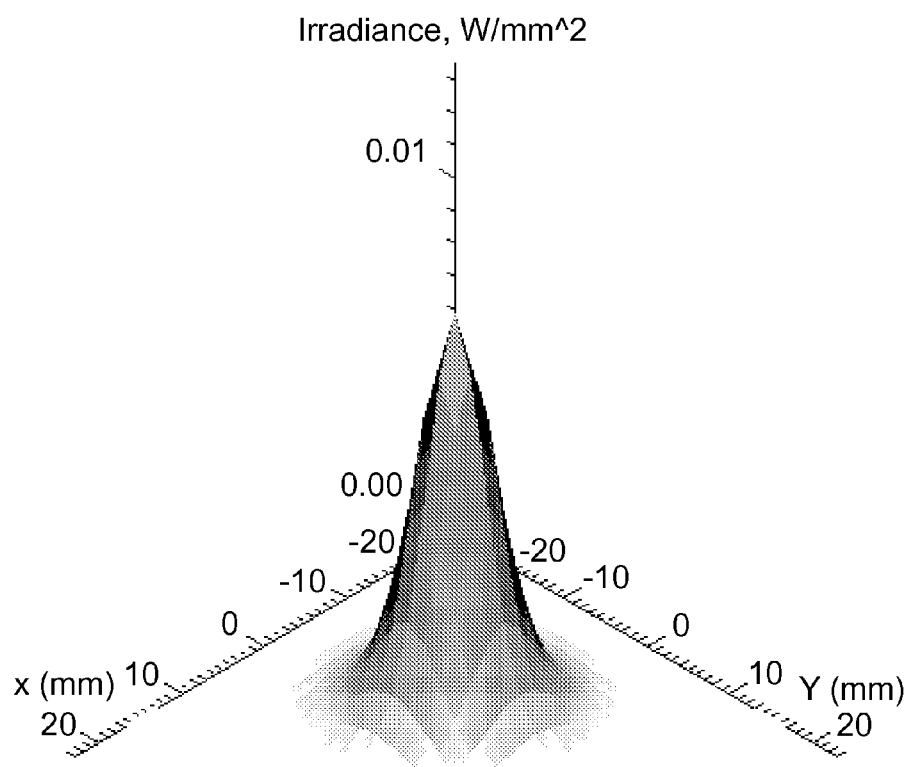
FIG. 5a is a graph of modeled/calculated irradiance as a function of transverse position for a light source having a design similar to that of FIG. 5, the irradiance being measured in a plane above or in front of the light source.
Figure 5C:
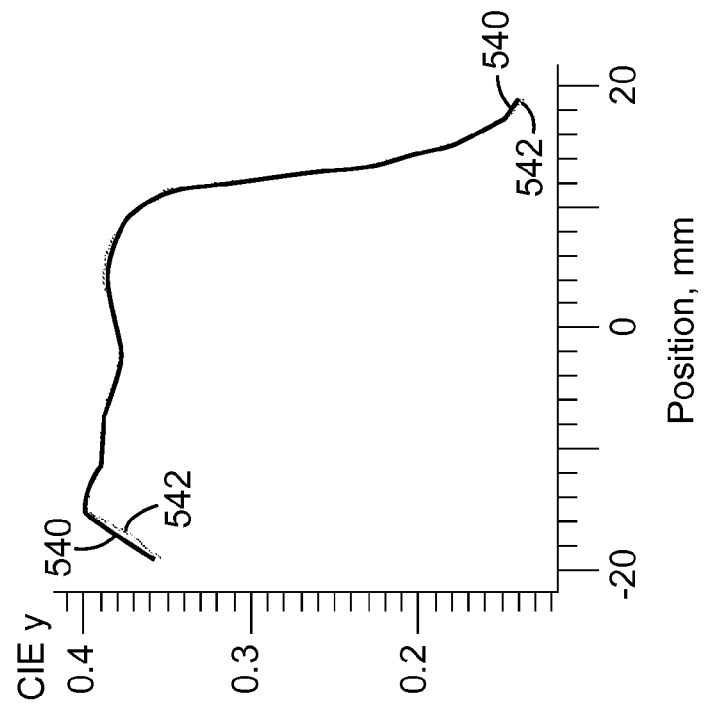
FIG. 5c is a graph of the CIE y color coordinate of the irradiance distribution of FIG. 5a, measured as a function of position along two orthogonal axes.
Figure 5B:
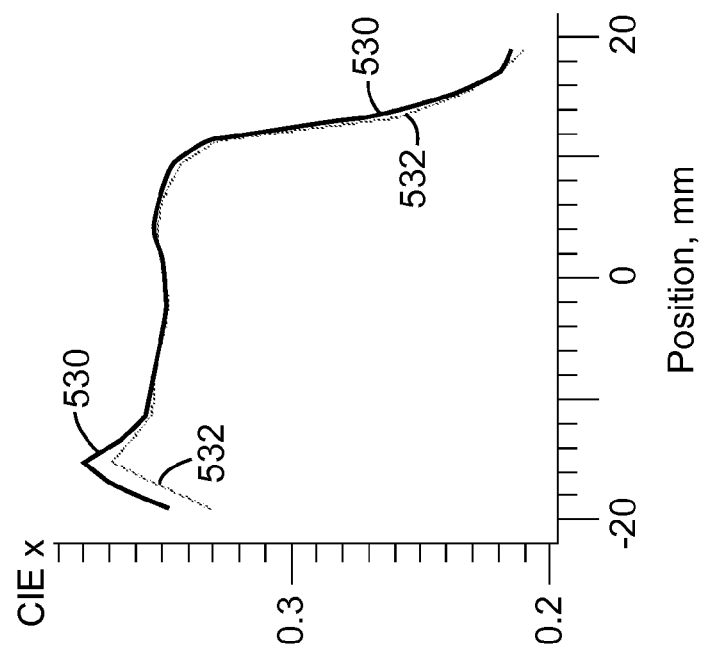
FIG. 5b is a graph of the CIE x color coordinate of the irradiance distribution of FIG. 5a, measured as a function of position along two orthogonal axes.

The output light provided by this embodiment of light source 510 was modeled using the LightTools software. Of particular interest was the physical distribution of the output light as observed in an observation plane disposed 5 mm above the plane of the LEDs, which was about 2.5 mm above the apex of the plano-convex lens and dichroic reflector 516. FIG. 5a depicts the total irradiance or brightness of the output light in this observation plane as a function of position in the plane. FIGS. 5b and 5c depict the CIE chromaticity coordinates of the output light in the observation plane along two orthogonal in-plane axes, where curves 530 and 532 depict the CIE "x" coordinate as a function of position in the observation plane, and curves 540 and 542 depict the CIE "y" coordinate as a function of position in the observation plane. (The reader should not confuse these CIE "x" and "y" chromaticity coordinates with the spatial x and y coordinates in FIG. 5a, which are given in millimeters of displacement relative to the optical axis, in the observation plane.) Curves 530 and 540 correspond to measurements along one in-plane axis, and curves 532 and 542 correspond to measurements along the orthogonal in-plane axis in the observation plane.

FIG. 5a demonstrates that the light source 510 is capable of emitting a high brightness, low etendue output beam. Comparison of the curves in FIGS. 5b and 5c reveals that the output beam exhibits an unexpectedly uniform distribution of color over the area of the output beam, even though significantly different colors are generated at different positions or locations underneath the convex dichroic reflector. For example, in the plane of the LED and phosphor, the LEDs 512a, 512b emit blue light, while the portions of the phosphor layer at the image regions 512a', 512b' emit substantially yellow light.

Figure 6:
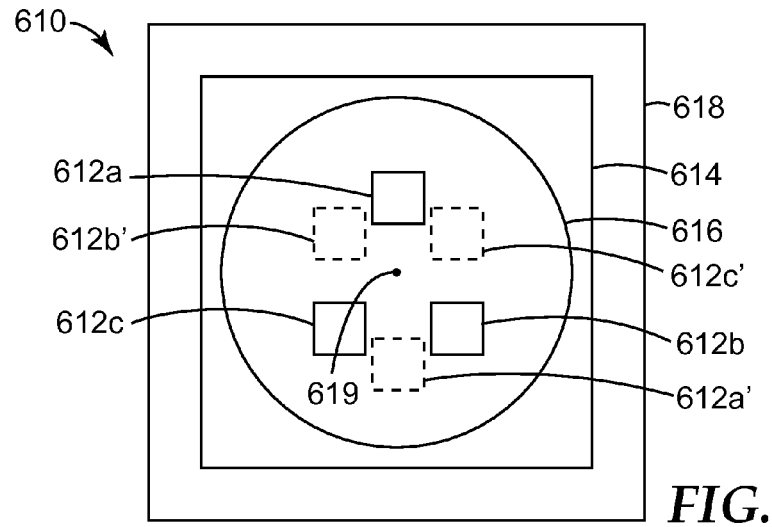
FIG. 6 is a schematic plan view of a broadband light source that includes three LEDs.

FIG. 6 is a schematic plan view of a broadband light source 610 that is similar to light source 410 of FIG. 4 and light source 510 of FIG. 5, except that the light source 610 has three blue-light emitting LEDs 612a, 612b, 612c. The LEDs 612a, 612b, 612c are disposed on a substrate 618, the substrate also having thereon an oversized phosphor layer 614 that emits longer wavelength visible light when exposed to the blue light from the LEDs.

The source 610 also includes a dichroic reflector 616. In the plan view of FIG. 6, only the shape or circumference of the lower base of the dichroic reflector is seen, but the reader will understand that the reflector has a convex shape similar to the dichroic reflectors of FIGS. 1 and 2. The reflector 616 opens toward and encompasses the LEDs and a disk-shaped portion of the phosphor layer 614. The center of the disk-shaped portion is marked by a point 619, which also corresponds to the center of curvature for the convex reflector 616. The LEDs 612a, 612b, 612c are positioned relatively close to the point 619 along different in-plane axes that are separated from each other by angles of about 120 degrees. The convex reflector 616 produces an image of the LED 612a in the image region 612a', and an image of the LED 612b in the image region 612b', and an image of the LED 612c in the image region 612c'.

An embodiment of the light source 610 was modeled using LightTools™ optical design software, in an analogous manner to the light source that was modeled from light sources 410 and 510. Some relevant design parameters of the modeled embodiment of light source 610 included the following:

the phosphor layer was assumed to be composed of Ce:YAG particles of refractive index 1.8 immersed in a silicone binder of refractive index 1.41, the layer having a physical thickness of 0.1 mm;

the LEDs were each assumed to be square with in-plane dimensions of 1 mm by 1 mm, a thickness of 10 microns, and an output wavelength of 460 nm. Each LED was also assumed to have a reflective coating on its back surface (adjacent the phosphor layer), the reflective coating having a 50% reflectivity and 50% absorption;

the dichroic reflector was assumed to be disposed on a hemispherical convex surface of a plano-convex lens made of BK7 glass, the lens having a diameter of 5 mm and a radius of curvature of 2.5 mm. The dichroic reflector was assumed to have a reflectivity of 90% and a transmission of 10% for normally incident light at the 460 nm LED wavelength. The dichroic reflector was also assumed to have a transmission of about 100% for normally incident light whose wavelength was 490 nm or greater;

the plano-convex lens was positioned such that its planar side was disposed at the top surface of the LEDs, and the space between the planar side of the lens and the top of the phosphor layer was filled with silicone material of index 1.41, the silicone material thus also encapsulating the LEDs.

Figure 6A:
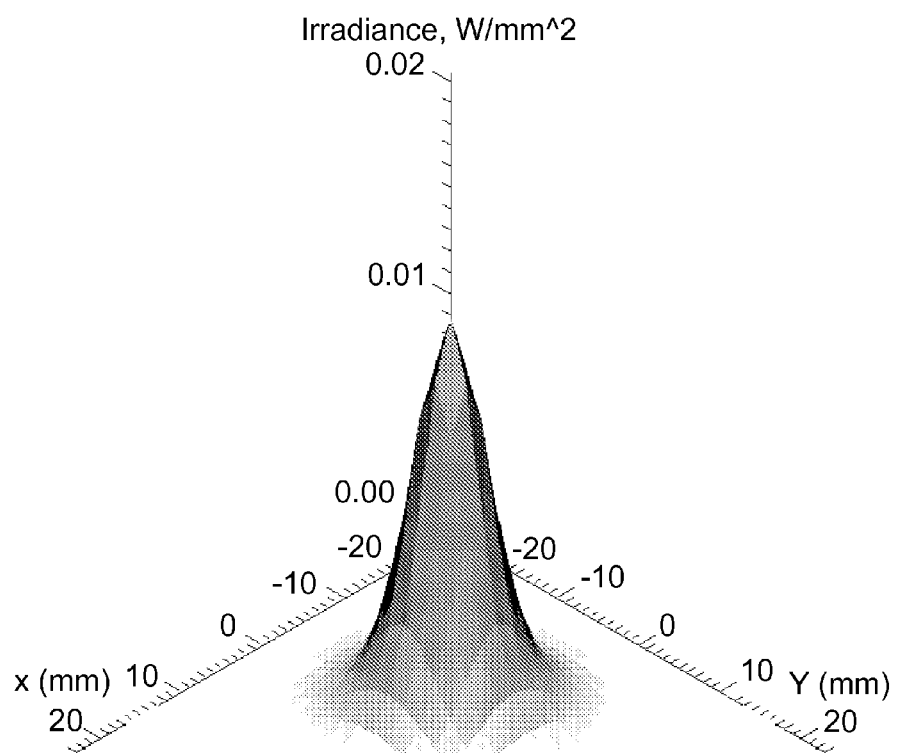
FIG. 6a is a graph of modeled/calculated irradiance as a function of transverse position for a light source having a design similar to that of FIG. 6, the irradiance being measured in a plane above or in front of the light source.
Figure 6C:
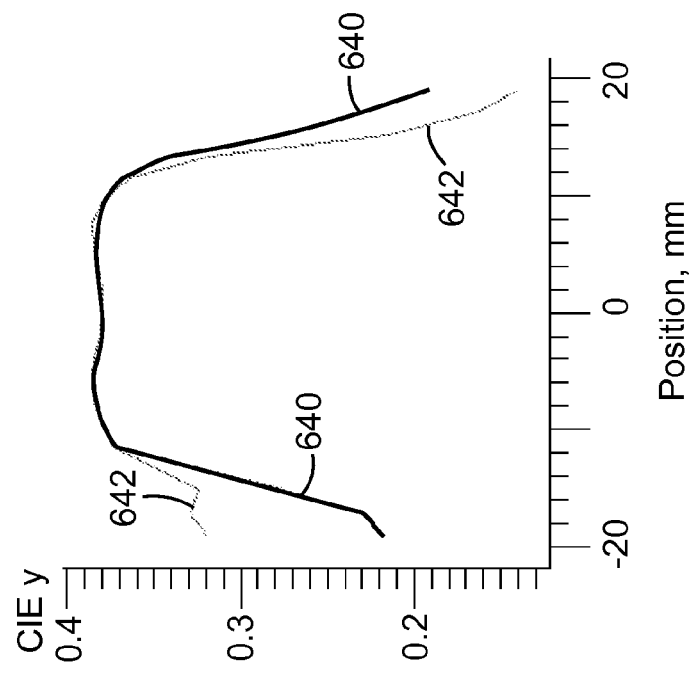
FIG. 6c is a graph of the CIE y color coordinate of the irradiance distribution of FIG. 6a, measured as a function of position along two orthogonal axes.
Figure 6B:
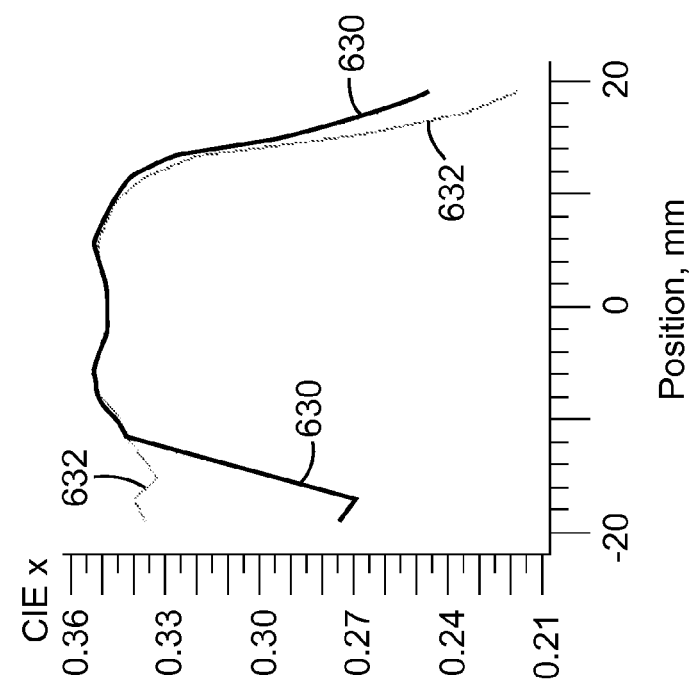
FIG. 6b is a graph of the CIE x color coordinate of the irradiance distribution of FIG. 6a, measured as a function of position along two orthogonal axes.

The output light provided by this embodiment of light source 610 was modeled using the LightTools software. Of particular interest was the physical distribution of the output light as observed in an observation plane disposed 5 mm above the plane of the LEDs, which was about 2.5 mm above the apex of the plano-convex lens and dichroic reflector 616. FIG. 6a depicts the total irradiance or brightness of the output light in this observation plane as a function of position in the plane. FIGS. 6b and 6c depict the CIE chromaticity coordinates of the output light in the observation plane along two orthogonal in-plane axes, where curves 630 and 632 depict the CIE "x" coordinate as a function of position in the observation plane, and curves 640 and 642 depict the CIE "y" coordinate as a function of position in the observation plane. (The reader should not confuse these CIE "x" and "y" chromaticity coordinates with the spatial x and y coordinates in FIG. 5a, which are given in millimeters of displacement relative to the optical axis, in the observation plane.) Curves 630 and 640 correspond to measurements along one in-plane axis, and curves 632 and 642 correspond to measurements along the orthogonal in-plane axis in the observation plane.

FIG. 6a demonstrates that the light source 610 is capable of emitting a high brightness, low etendue output beam. Comparison of the curves in FIGS. 6b and 6c reveals that the output beam exhibits an unexpectedly uniform distribution of color over the area of the output beam, even though significantly different colors are generated at different positions or locations underneath the convex dichroic reflector. For example, in the plane of the LED and phosphor, the LEDs 612a, 612b, 612c emit blue light, while the portions of the phosphor layer at the image regions 612a', 612b', 612c' emit substantially yellow light.

Figure 7:
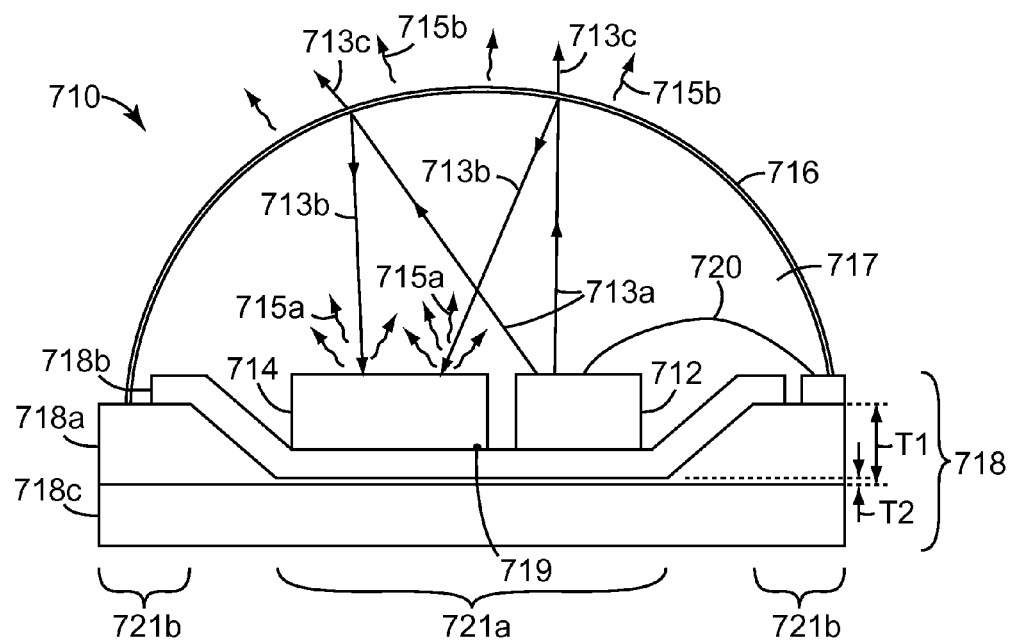
FIG. 7 is a schematic side or sectional view of a broadband light source, showing details of construction of an exemplary flexible substrate.

Turning now to FIG. 7, we see there a schematic side or sectional view of a broadband light source 710, showing details of construction of an exemplary flexible substrate which is included as an element of the light source. Except for the substrate and its constituent components, virtually all other depicted elements of the light source 710 have counterpart elements in the light source 110 of FIG. 1.

Thus, the light source 710 includes a blue-light emitting LED 712 disposed on a substrate 718, the substrate also having thereon a phosphor layer 714 that emits longer wavelength visible light when exposed to the blue light from the LED. The LED 712 may connect to a conductive trace by a wire bond 720.

The source 710 also includes a dichroic reflector 716 having a convex shape that opens toward and encompasses the LED and the phosphor layer 714. The center of curvature for the reflector 716 is marked by a point 719. The LED 712 is positioned relatively close to the point 719, and so is the phosphor layer 714. Just as in FIG. 1, the phosphor layer 714 is shown slightly oversized relative to the LED.

Also similar to FIG. 1, blue light 713a emitted by the LED 712 is partially reflected by the dichroic reflector 716 to produce reflected LED light 713b, and partially transmitted to produce transmitted LED light 713c. The reflected LED light 713b is directed onto the phosphor layer 714, which excites the phosphor and causes the phosphor layer to emit longer wavelength light 715a. This longer wavelength light is highly transmitted by the dichroic reflector 716 to produce phosphor light 715b. The transmitted light 713c and transmitted light 715b combine spatially to provide broadband output light, such as white light, for the light source 710. The interior space 717 may comprise a suitable light-transmissive glass or polymer material that encapsulates the LED and the phosphor, and the dichroic reflector may be applied to the outer surface of such an encapsulant. Alternatively, the interior space 717 may be unfilled.

One difference between source 710 and source 110 is the detail provided for the substrate portion of the light source. In source 710, the substrate 718 is preferably thin for flexibility, greater heat conduction (and lower thermal resistance) to an underlying heat sink (not shown), and for space savings. Although generally thin, the substrate 718 is desirably molded, etched, or otherwise shaped to be even thinner in a cavity region 721a compared to an adjacent or neighboring region 721b, these regions being shown as separated by a beveled transition region. The reduced thickness, which provides an even greater heat conduction in the cavity region relative to the neighboring region, is desirably associated with the reduced thickness of a dielectric layer 718a which forms part of the substrate. In the figure, the dielectric layer 718a is shown to have a thickness T1 in the neighboring regions 721b, and a smaller thickness T2 in the cavity region 721a. Disposed atop the dielectric layer 718a is an electrically conductive layer 718b, which may be patterned as desired to provide power to the LED. A thermally conductive layer 718c is disposed on an opposite major surface of the dielectric layer compared to layer 718b. In some cases, the layers 718b, 718c may be composed of the same material, e.g., copper, while in other cases different materials may be used. Thus, the electrically conductive layer 718b may also be thermally conductive, and the thermally conductive layer 718c may also be electrically conductive. The thermally conductive layer 718c is preferably bonded to a suitable heat sink, e.g., using a suitable thermal interface material.

The thinned region of substrate 718 is preferably associated with a corresponding thinned region of the dielectric layer 718a, which is in many cases a key structural component of the substrate. Suitable dielectric layers include polyesters, polycarbonates, liquid crystal polymers, and polyimides. Suitable polyimides include those available under the trade names KAPTON, available from DuPont; APICAL, available from Kaneka Texas corporation; SKC Kolon PI, available from SKC Kolon PI Inc.; and UPILEX and UPISEL, available from Ube Industries. Polyimides available under the trade designations UPILEX S, UPILEX SN, and UPISEL VT, all available from Ube Industries, Japan, are particularly advantageous in many applications. These polyimides are made from monomers such as biphenyl tetracarboxylic dianhydride (BPDA) and phenyl diamine (PDA).

The dielectric layer 718a may be thinned in the cavity region using any suitable method such as chemical etching, plasma etching, focused ion-beam etching, laser ablation, and punching. With regard to etching, any suitable etchant may be used, and the preferred etchant may depend on the material(s) used in the dielectric layer. Suitable etchants may include alkali metal salts, e.g. potassium hydroxide; alkali metal salts with one or both of solubilizers, e.g., amines, and alcohols, such as ethylene glycol. Suitable chemical etchants may include KOH/ethanol amine/ethylene glycol etchants such as those described in more detail in U.S. Patent Publication US 2007/0120089, incorporated herein by reference. Other suitable chemical etchants may include KOH/glycine etchants such as those described in more detail in commonly assigned U.S. patent application 61/409,791, filed Nov. 3, 2010, incorporated herein by reference. After etching, the dielectric layer may be treated with an alkaline KOH/potassium permanganate (PPM) solution, e.g., a solution of about 0.7 to about 1.0 wt % KOH and about 3 wt % KMnO4. The dielectric layers may be clad on one or both sides with a conductive layer, e.g., layers 718b and 718c of FIG. 7. The conductive layers may be composed of any suitable electrically and/or thermally conductive materials, but typically comprise copper. If the conductive layer(s) are to be formed into circuits, they may be pre-patterned if desired. In some cases, the flexible substrate may have a multilayer construction, including multiple layers of dielectric material and conductive material in a stacked arrangement.

The type of thinning procedure used can affect the transition between the cavity region and the neighboring region, as well as the characteristics of the side walls of the dielectric layer and other layers in the transition region. Chemical etching can be used to produce relatively shallow side walls, e.g., typical side wall angles in a range from about 5 to 60 degrees measured from the plane of the flexible substrate, or from about 25 to 28 degrees. Other techniques, such as punching, plasma etching, focused ion-beam etching, and laser ablation, may produce much steeper side walls, e.g. wall angles up to about 90 degrees. In some cases, such as with punching, a hole may be formed completely through the dielectric layer, which is discussed further below. In such cases, other layers of the flexible substrate, such as conductive layers 718b and/or 718c, may be utilized to provide physical support for the LED(s) and/or phosphor layer in the cavity region.

In exemplary embodiments, the dielectric layer is significantly thinner in the cavity region 721a compared to the neighboring region 721b to increase heat conduction away from the LED(s) and/or phosphor layer and to maintain these components at cooler operating temperatures. For example, the thickness T2 may be about 5 to 25% of T1. Furthermore, T2 may be greater than zero but no more than 10 microns, while T1 may be at least 20 microns. In exemplary embodiments, T1 may be no more than 200 microns. In addition to increasing heat conduction, the thinned nature of the cavity region can provide other advantages such as the formation of slanted side walls, which may be coated with a reflecting material to provide enhanced efficiency. Also, by attaching LED(s) and/or a phosphor layer to the substrate in the thinned cavity region, these components do not extend as high above the plane of the flexible substrate, producing a lower profile device that is better suited for low form factor applications.

Additional design details of exemplary flexible substrates suitable for use in the disclosed embodiments can be found in the following commonly owned U.S. patent applications, which are incorporated herein by reference: U.S. application 61/409,796, filed Nov. 3, 2010; U.S. application 61/409,801, filed Nov. 3, 2010.

Figure 8:
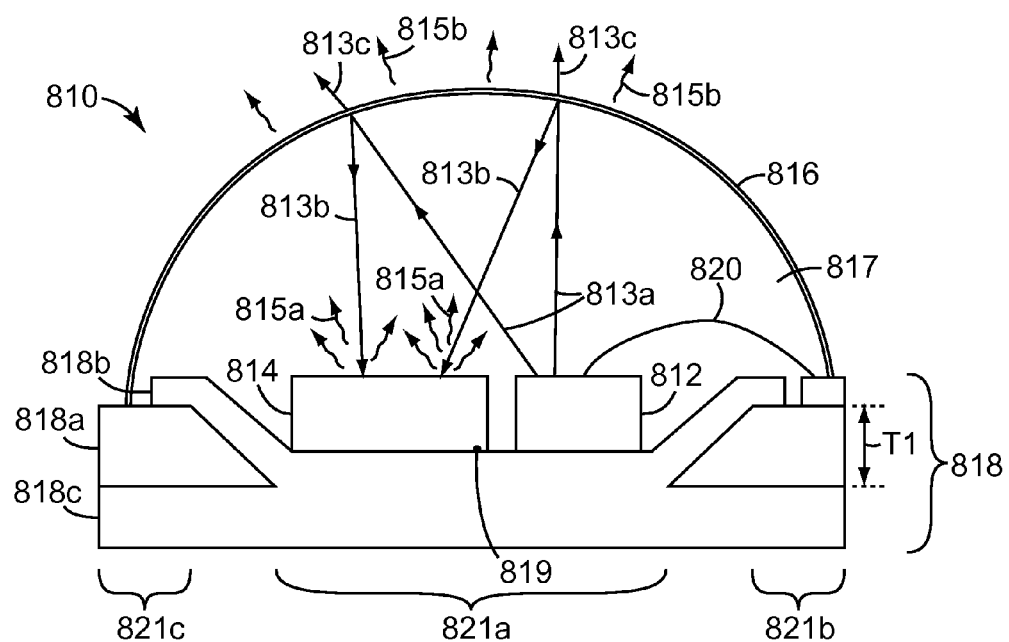
FIG. 8 is a schematic side or sectional view of another broadband light source that includes an exemplary flexible substrate.

FIG. 8 is a schematic side or sectional view of another broadband light source 810 that includes an exemplary flexible substrate. Except for a through-hole provided in the dielectric layer in the cavity region of the substrate, virtually all other depicted elements of the light source 810 have counterpart elements in the light source 710 of FIG. 7.

Thus, the light source 810 includes a blue-light emitting LED 812 disposed on a substrate 818, the substrate also having thereon a phosphor layer 814 that emits longer wavelength visible light when exposed to the blue light from the LED. The LED 812 may connect to a conductive trace by a wire bond 820.

The source 810 also includes a dichroic reflector 816 having a convex shape that opens toward and encompasses the LED and the phosphor layer 814. The center of curvature for the reflector 816 is marked by a point 819. The LED 812 is positioned relatively close to the point 819, and so is the phosphor layer 814. Just as in FIG. 1, the phosphor layer 814 is shown slightly oversized relative to the LED.

Also similar to FIG. 7, blue light 813a emitted by the LED 812 is partially reflected by the dichroic reflector 816 to produce reflected LED light 813b, and partially transmitted to produce transmitted LED light 813c. The reflected LED light 813b is directed onto the phosphor layer 814, which excites the phosphor and causes the phosphor layer to emit longer wavelength light 815a. This longer wavelength light is highly transmitted by the dichroic reflector 816 to produce phosphor light 815b. The transmitted light 813c and transmitted light 815b combine spatially to provide broadband output light, such as white light, for the light source 810. The interior space 817 may comprise a suitable light-transmissive glass or polymer material that encapsulates the LED and the phosphor, and the dichroic reflector may be applied to the outer surface of such an encapsulant. Alternatively, the interior space 817 may be unfilled.

The source 810 differs from source 710 chiefly by virtue of the dielectric layer 818a of the flexible substrate 818 having a hole or "via" that extends completely through the dielectric layer in a cavity region 821a. Thus, no portion of the dielectric layer 818a' remains in the cavity region 821a, and the thickness of the dielectric layer in that region (see T2 in FIG. 7) can be considered to be zero. The thickness of the dielectric layer 818a in neighboring regions 821b is T1, which may be the same as or similar to thickness T1 of FIG. 7.

Disposed atop the dielectric layer 818a is an electrically conductive layer 818b, which may be the same as or similar to layer 718b of FIG. 7. A thermally conductive layer 818c is disposed on an opposite major surface of the dielectric layer compared to layer 818b, and this thermally conductive layer may be the same as or similar to layer 718c of FIG. 7. One or both of layers 818b, 818c may be configured to provide physical support for the LED and phosphor layer in the cavity region 821a, in view of the absence of dielectric layer 818a in that region.

The distinguishing feature of light source 810, wherein a hole extends completely through the dielectric layer of the substrate in the cavity region, may also be applied to other embodiments discussed herein, including the light sources discussed in connection with FIGS. 1, 2, 4, 5, 6, and 7. Of course, the exemplary flexible substrates discussed in connection with FIG. 7 may also be incorporated into any of the other broadband light sources discussed herein, including those of FIGS. 1, 2, 4, 5, and 6.

Disclosed broadband light sources that incorporate the exemplary flexible substrates discussed in connection with FIGS. 7 and 8 can utilize not only blue-light emitting LEDs, but ultraviolet (UV) light emitting LEDs as well. Thus, for each embodiment discussed herein that utilizes an exemplary flexible substrate having a cavity region and a thicker neighboring region, including but not limited to the embodiments of FIGS. 7 and 8, each blue LED can be replaced with an LED that substantially emits UV light. With this replacement or substitution, two other components of each such light source may also be changed if desired: the dichroic reflector may be tailored to transmit much less of the (now UV) LED light, such that little or none of the UV LED light contributes to the broadband output light of the light source, and the dichroic reflector may also be tailored to have a higher transmission in the blue region of the visible spectrum so as to more easily transmit blue light that may be emitted by the phosphor layer; and the phosphor layer may be replaced with another phosphor layer if desired to ensure that the phosphor responds to the UV excitation light, and/or so that the longer wavelength light emitted by the phosphor in response to the UV LED light includes light in the blue region of the visible spectrum. Many phosphor materials that emit longer wavelength visible light when exposed to blue excitation light also emit longer wavelength visible light when exposed to UV excitation light.

Figure 9A:
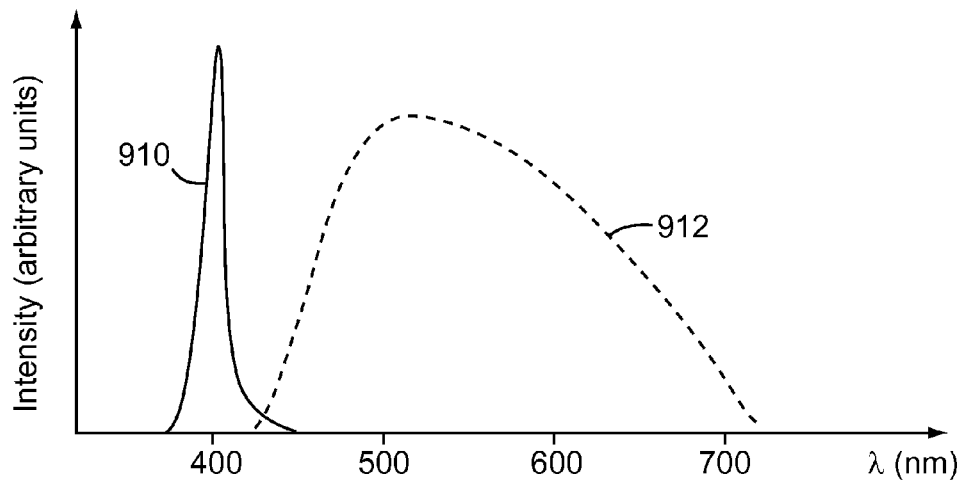
FIG. 9a is an idealized graph of the spectral intensity distributions of an exemplary UV LED and an exemplary phosphor.
Figure 9B:
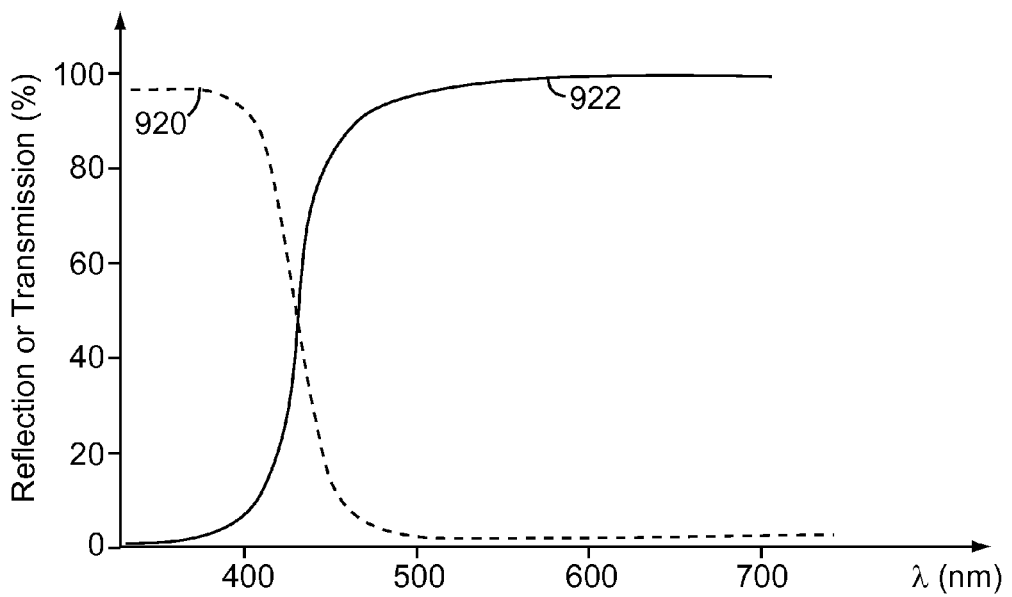
FIG. 9b is an idealized graph of the spectral reflectance or transmission of an exemplary dichroic reflector.
Figure 9C:
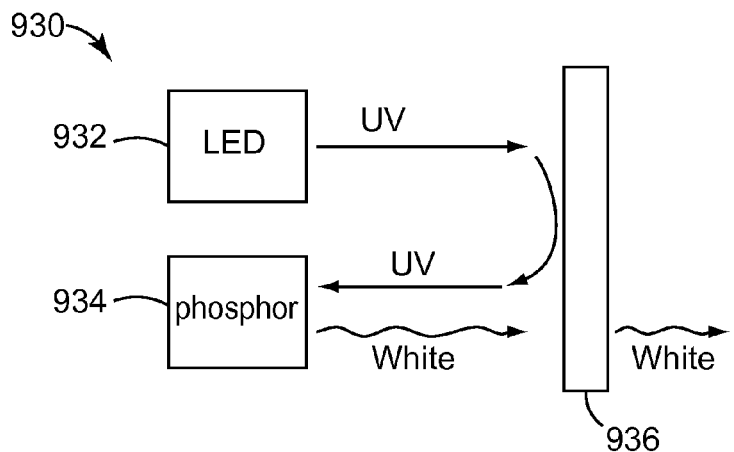
FIG. 9c is a schematic diagram showing how long wavelength light emitted by a phosphor can, with little or no light from the LED, provide broadband white output light for the light source.

In any case, relevant aspects of broadband light sources that utilize one or more LEDs that emit UV rather than blue light are provided in FIGS. 9a, 9b, and 9c.

FIG. 9a is an idealized graph of the spectral intensity distributions of an exemplary UV LED and an exemplary phosphor. Curve 910 represents in schematic fashion the approximate spectral distribution of a UV-light emitting LED. Curve 912 represents in schematic fashion the approximate spectral distribution of light emitted by an exemplary phosphor material when exposed to light from the UV LED. The reader will understand that these curves are provided to aid in the understanding of the invention, and are not intended to be limiting. The reader will also understand that the light of curve 912 may by itself provide broadband output light having an appearance that is substantially white or of other desired hues.

FIG. 9b is an idealized graph of the spectral reflectance or transmission of an exemplary dichroic reflector for use with UV LEDs and white or other broadband visible light emitting phosphors. Here again, the reader will understand that these curves are provided to aid in the understanding of the invention, and are not intended to be limiting. Curve 920 represents in schematic fashion the percent reflection of the dichroic reflector for normally incident light, and curve 922 represents the corresponding percent transmission. These curves are substantially complementary because of the low loss nature of most dichroic reflectors. Light that strikes the dichroic reflector at angles other than normal incidence may experience transmission and reflection characteristics that are similar to or substantially different from curves 920, 922, the degree of similarity or difference depending on the angle of incidence and also potentially depending on the polarization state of the light as discussed above in connection with FIG.

3b. For similar reasons, therefore, it is often generally advantageous to position the UV LEDs so that they are relatively close to the optical axis of the light source and to the center of curvature of the dichroic reflector. This arrangement can help to keep incidence angles of light from the LED, and light from the phosphor, reasonably close to normal incidence over the area of the dichroic reflector.

In some cases, curve 922 may exhibit little or no transmission for UV light, e.g. in the vicinity of 400 nm or less, so that little or no UV light from the LED is included in the output of the broadband light source (and so that virtually all of the UV LED light impinging upon the dichroic reflector is reflected onto the phosphor layer). In other cases, some UV light may be transmitted by the dichroic reflector, and some amount of UV light in the output of the broadband light source may not be considered to be detrimental. The curve 922 may be tailored to have a high transmission over a large majority of the visible wavelength spectrum, e.g., over red, green, and blue regions of the visible spectrum. Such a characteristic of the dichroic reflector allows for not only red and green, but also blue light emitted by the phosphor layer to be included in the output of the broadband light source. The broadband output light from the light source may be substantially white, and may consist essentially of light emitted by the phosphor layer with little or no light from the UV LED. The color temperature of such white light may be tailored by judicious design of the phosphor layer, e.g., by selection of appropriate relative amounts of different phosphor materials used in a mixture to ensure the desired proportion of red, green, and blue wavelengths, or of other selected wavelengths or colors to achieve the target color temperature or hue.

FIG. 9c is a schematic diagram showing a light source 930 in which light from a UV LED 932 is used to excite longer wavelength light in a phosphor 934, the longer wavelength light by itself providing a broadband (e.g. white) visible output light of the light source. The long wavelength light from the phosphor may have a white appearance or other color depending on the phosphor material(s) used. A dichroic reflector 936, which again is shown only schematically, may allow little or no UV light from the LED 932 to be transmitted, and may reflect substantially all of the impinging UV LED light onto the phosphor 934. The reflected UV LED light excites the phosphor and causes it to emit the Stokes-shifted longer wavelength light, which is highly transmitted by the dichroic reflector 936. The longer wavelength light from the phosphor, by itself, may provide broadband output light, e.g., white light.

Figure 10:
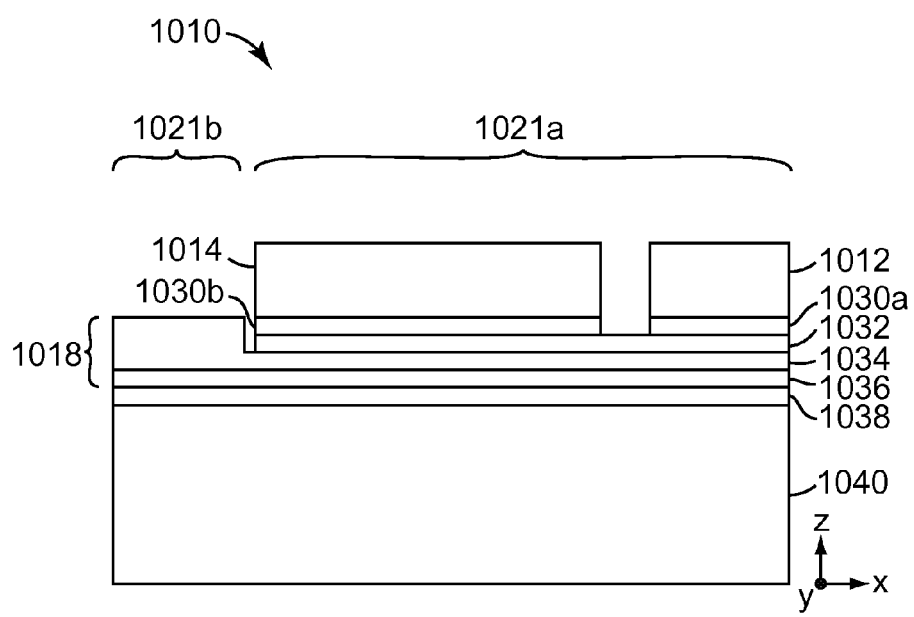
FIG. 10 is a schematic side or sectional view of a broadband light source that was thermally modeled.

FIG. 10 is a schematic side or sectional view of a portion of a broadband light source 1010 that was thermally modeled. The light source includes an LED 1012 and a phosphor layer 1014 disposed on a thin flexible substrate 1018. The LED was assumed to be a blue-light emitting LED composed of GaN, with an external efficiency of 25%. The flexible substrate 1018 may be considered to include or consist essentially of a dielectric layer 1034 composed of polyimide, an electrically conductive layer 1032 composed of copper disposed on one major surface of the dielectric layer, and a thermally conductive layer 1036, also composed of copper, disposed on an opposite major surface of the dielectric layer. The dielectric layer is patterned or otherwise shaped to have a first thickness in a cavity region 1021a, and a second thickness (greater than the first thickness) in a neighboring region 1021b. The LED attaches to the substrate 1018 via a solder layer 1030a. The phosphor layer 1014 attaches to the substrate via a reflective layer 1030b. Beneath the substrate 1018, a thermal interface material 1038 is used to attach and thermally couple the substrate to a heat sink 1040, which was assumed to be composed of aluminum.

Although a convex dichroic reflector is not shown in FIG. 10, the model essentially included it by assuming that all of the blue light emitted by the LED 1012 impinges upon the upper surface of the phosphor layer 1014, and all of this blue light is absorbed by the phosphor layer 1014. The model further assumed that the phosphor layer converts 80% of the energy from the absorbed LED light into re-emitted longer wavelength light, and converts 20% of the energy from the absorbed LED light into heat. The phosphor layer was assumed to composed primarily of silicone resin (within which phosphor particles may be distributed), the thermal conductivity of silicone resin being less than 1% of the thermal conductivity of the GaN LED material.

The thickness of phosphor layer 1014 was assumed to be 100 microns, and the thickness of the LED 1012 was assumed to be 300 microns. The reflector layer 1030b was assumed to be a 1 micron thick layer of silver. The solder layer 1030a was assumed to be a 30 micron layer comprising 10% gold in tin. The polyimide layer 1034 was assumed to be 15 microns thick in the neighboring region 1021b, and 5 microns thick in the cavity region 1021a. The copper layers 1032, 1036 were each assumed to be 35 microns thick.

The model then assumed that a 1 mm² LED was operated to emit light at a power of 1 watt, and the steady state temperatures of the various portions of the source 1010 were calculated. The temperature of the heat sink 1040 was assumed to be 25° C. The LED 1012 was found to have a temperature throughout nearly all of its volume within a range from 38 to 44° C., with small portions of the LED being cooler than 38° C. The phosphor layer 1014, on the other hand, was found to have a substantial temperature gradient along the thickness direction, with the uppermost portion of the layer 1014 having a temperature in a range from 83 to 89° C., and the lowermost portion of layer 1014 having a temperature in a range from 57 to 64° C.

The higher temperatures computed for the phosphor layer are consistent with the known large discrepancy between the thermal conductivity of silicone and that of GaN. However, the calculated temperatures of both the LED and the phosphor layer actually represent significant improvements, i.e., reductions in steady state operating temperature for the LED and phosphor layer, relative to an embodiment that does not incorporate the thinning of the dielectric layer 1034 in the cavity region 1021a. Furthermore, the front-illumination configuration of the phosphor layer, in combination with placement of the reflector layer behind the phosphor layer, allowed the phosphor layer thickness to be about half the thickness that would be required of a similar phosphor layer if it were coated on the top emitting surface of the LED (and thus not in a configuration in which light from the LED travels to the dichroic reflector without passing through the phosphor layer), and this reduction in phosphor layer thickness also helped to reduce the operating temperature of the phosphor layer.

Referring back now to FIG. 2, an embodiment of the light source 210, described above, was modeled using Light-Tools™ optical design software, in an analogous manner to the light sources that were modeled from light sources 410, 510, and 610. Some relevant design parameters of the modeled embodiment of light source 210 included the following:

the phosphor layer was assumed to be composed of Ce:YAG particles of refractive index 1.8 immersed in a silicone binder of refractive index 1.41, the layer having a physical thickness of 0.1 mm;

the LEDs were each assumed to be square with in-plane dimensions of 1 mm by 1 mm, a thickness of 10 microns, and an output wavelength of 460 nm. Each LED was also assumed to have a reflective coating on its back surface (adjacent the phosphor layer), the reflective coating having a 50% reflectivity and 50% absorption;

the dichroic reflector was assumed to be disposed on a hemispherical convex surface of a plano-convex lens made of BK7 glass, the lens having a diameter of 5 mm and a radius of curvature of 2.5 mm. The dichroic reflector was assumed to have a reflectivity of 90% and a transmission of 10% for normally incident light in a range from 400 to 490 nm. The dichroic reflector was also assumed to have a transmission of about 100% for normally incident light whose wavelength was 490 nm or greater;

the plano-convex lens was positioned such that its planar side was disposed at the top surface of the LEDs, and the space between the planar side of the lens and the top of the phosphor layer was filled with silicone material of index 1.41, the silicone material thus also encapsulating the LEDs.

Figure 11B:
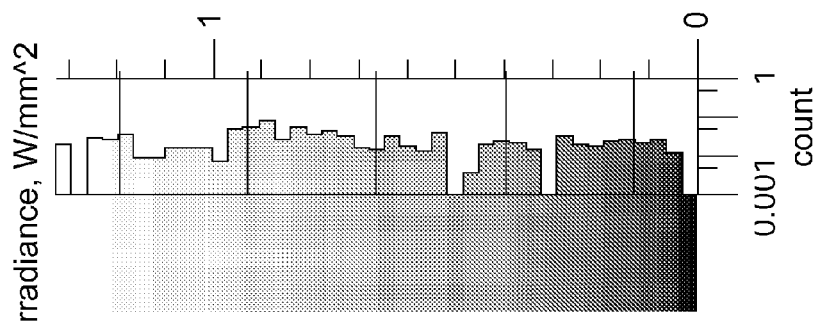
FIG. 11b is a key for FIG. 11a showing how grayness level corresponds to irradiance.
Figure 11A:
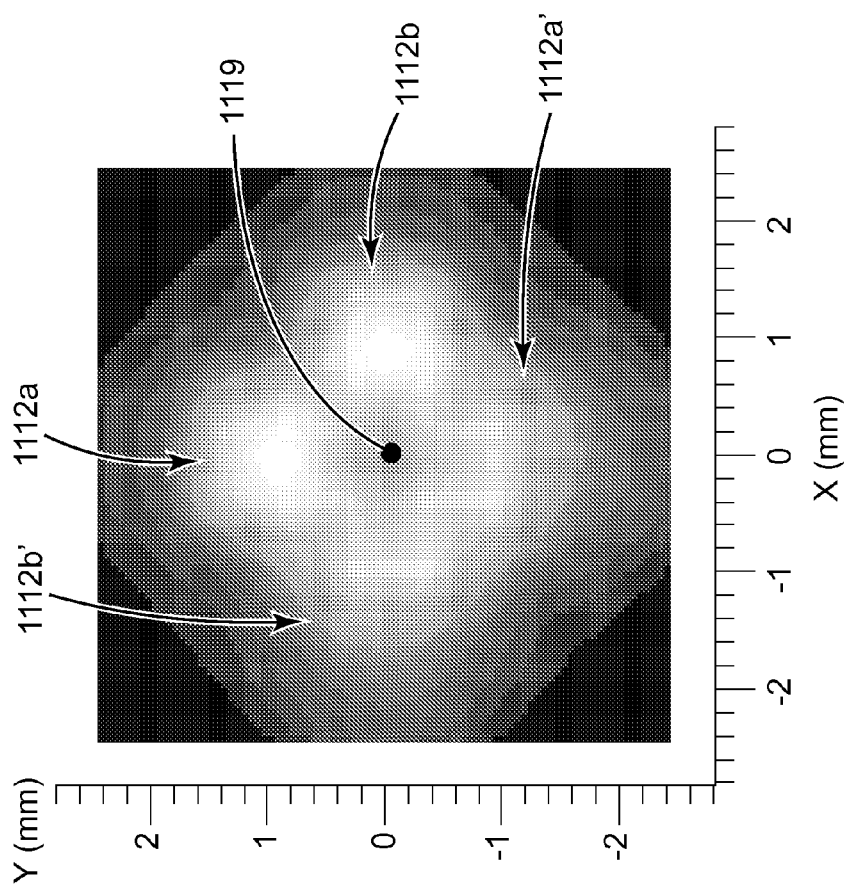
FIG. 11a is a graph of calculated intensity versus position for a modeled broadband light source having two LEDs whose position on the substrate has been optimized.

The output light provided by this embodiment of light source 210 was modeled using the LightTools software. Unlike the modeled intensity distributions depicted in FIGS. 4a, 5a, and 6a, of interest to the present study was the physical distribution of the output light in an interior observation plane disposed to substantially coincide with the upper surfaces of the LEDs 212a, 212b and the lower (planar) surface of the plano-convex lens. In this interior observation plane, the light had a calculated spatial distribution of irradiance which is shown in FIG. 11a. Irradiance is represented in the figure by a grayscale representation, with the correspondence of grayscale to irradiance for this figure shown in the key of FIG. 11b.

We see in the figure the brightest regions 1112a, 1112b, produced by blue light emitted by the LEDs, and corresponding substantially in shape and position to the LEDs 212b, 212a, respectively. We also see bright regions 1112a', 1112b', produced by longer wavelength (yellow) light emitted by portions of the phosphor layer, and corresponding substantially to images of regions 1112a, 1112b, respectively. The regions 1112a, 1112b and their respective images are formed on opposite side of central point 1119, which may represent the approximate center of curvature of the dichroic reflector, and the intersection of the optical axis of the light source 210 with the interior observation plane.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A light source, comprising:
a first ultraviolet emitting LED;
a layer of phosphor material, the phosphor material adapted to emit light at longer visible wavelengths in response to excitation from the ultraviolet light emitted by the first LED;
a dichroic reflector configured to reflect a first portion of the light emitted by the first LED onto the layer of phosphor material in such a way that as light propagates from the first LED to the dichroic reflector it does not pass through the layer of phosphor material, the dichroic reflector substantially transmitting light at the longer visible wavelengths;
wherein the dichroic reflector transmits little to no UV light and transmits a substantial portion of blue light emitted by the phosphor material when exposed to UV excitation light.

2. The source of claim 1, wherein the first LED and the layer of phosphor material are substantially coplanar.

3. The source of claim 1, further comprising a substrate on which at least the first LED is disposed.

4. The source of claim 3, wherein the layer of phosphor material is also disposed on the substrate.

5. The source of claim 4, further comprising a second ultraviolet-light emitting LED disposed on the substrate.

6. The source of claim 3, wherein the substrate is flexible and includes a dielectric layer having a cavity region and a neighboring region adjacent the cavity region, the first LED being disposed in the cavity region.

7. The source of claim 6, wherein the cavity region is characterized by a depression in the dielectric layer, the dielectric layer having a first thickness in the neighboring region and a second thickness in the cavity region, the second thickness being greater than zero but less than the first thickness.

8. The source of claim 7, wherein the first thickness is at least 20 microns, and the second thickness is no more than 10 microns.

9. The source of claim 6, wherein the cavity region is characterized by a hole that extends completely through the dielectric layer.

10. The source of claim 6, the substrate further comprising an electrically conductive material disposed on the dielectric layer, the LED being disposed on the electrically conductive material.

11. The source of claim 10, wherein the electrically conductive layer is disposed on a first side of the dielectric layer, the substrate further including a thermally conductive layer disposed on a second side of the dielectric layer opposite the first side.

12. The source of claim 1, wherein the source has a substantially uniform distribution of color over a substantial area of an output beam.

13. A light source, comprising:
- a first LED adapted to emit light at a first wavelength;
- a layer of phosphor material, the phosphor material adapted to emit light at longer wavelengths than the first wavelength in response to excitation from the light emitted by the first LED;
- a dichroic reflector configured to reflect a first portion of the light emitted by the first LED onto the layer of phosphor material in such a way that as light propagates from the first LED to the dichroic reflector it does not pass through the layer of phosphor material, the dichroic reflector substantially transmitting light at the longer wavelengths;
- wherein the dichroic reflector transmits little to no UV light and transmits a substantial portion of blue light emitted by the phosphor material when exposed to UV excitation light; and
- wherein an interior space is formed between the first LED and the dichroic reflector.

14. The light source of claim 13, wherein the interior space is formed from an encapsulant that encapsulates the LED and phosphor material.

15. The light source of claim 14, wherein the interior space is formed from at least one of a glass material and a polymer material.

16. The light source of claim 13, wherein the dichroic reflector is applied to an outer surface of the encapsulant.

17. The light source of claim 15, wherein the dichroic reflector is formed as a free standing structure separate from the encapsulant.

18. The light source of claim 14, wherein the interior space is formed from air.

19. A method of generating a broadband light source, comprising:
- transmitting blue or ultraviolet light from a first LED towards a dichroic reflector in such a way that as light propagates from the first LED to the dichroic reflector it does not pass through a separately disposed layer of phosphor material;
- reflecting a first portion of the light from the first LED by the dichroic reflector towards the layer of phosphor material, the phosphor material adapted to emit light at longer visible wavelengths in response to excitation from the light emitted by the first LED; and
- substantially transmitting light at the longer visible wavelengths through the dichroic reflector;
- wherein the dichroic reflector transmits little to no UV light and transmits a substantial portion of blue light emitted by the phosphor material when exposed to UV excitation light.

20. The method of claim 19, wherein the broadband light source has a substantially uniform distribution of color over a substantial area of an output beam.

* * * * *